US008917552B2

(12) United States Patent
Maeda

(10) Patent No.: US 8,917,552 B2
(45) Date of Patent: Dec. 23, 2014

(54) NONVOLATILE SEMICONDUCTOR STORAGE DEVICE

(71) Applicant: Kabushiki Kaisha Toshiba, Tokyo (JP)

(72) Inventor: Takashi Maeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 13/783,360

(22) Filed: Mar. 3, 2013

(65) Prior Publication Data

US 2013/0336056 A1 Dec. 19, 2013

(30) Foreign Application Priority Data

Jun. 18, 2012 (JP) ................. 2012-136739

(51) Int. Cl.
*G11C 11/34* (2006.01)
*G11C 16/04* (2006.01)
*G11C 16/26* (2006.01)
*G11C 16/30* (2006.01)
*G11C 16/34* (2006.01)

(52) U.S. Cl.
CPC ........ *G11C 16/3404* (2013.01); *G11C 2213/71* (2013.01); *G11C 16/0483* (2013.01); *G11C 16/26* (2013.01); *G11C 16/30* (2013.01)
USPC .............. 365/185.17; 365/185.18; 365/185.2; 365/185.21; 365/185.22; 365/185.24; 365/185.29; 365/185.33

(58) Field of Classification Search
USPC ............... 365/185.17, 185.18, 185.2, 185.21, 365/185.22, 185.24, 185.29, 185.33
See application file for complete search history.

(56) References Cited

U.S. PATENT DOCUMENTS

| 8,194,460 B2* | 6/2012 | Moschiano et al. ..... 365/185.17 |
| 8,233,323 B2* | 7/2012 | Hishida et al. ........... 365/185.17 |
| 8,508,999 B2* | 8/2013 | Liu et al. .................. 365/185.17 |
| 2007/0252201 A1 | 11/2007 | Kito et al. |
| 2010/0124116 A1 | 5/2010 | Maeda et al. |
| 2010/0207195 A1 | 8/2010 | Fukuzumi et al. |
| 2010/0290774 A1 | 11/2010 | Matsuoka et al. |
| 2011/0235421 A1 | 9/2011 | Itagaki et al. |
| 2012/0134210 A1 | 5/2012 | Maeda |
| 2012/0320677 A1 | 12/2012 | Maejima et al. |

FOREIGN PATENT DOCUMENTS

| JP | 2006-086674 | 3/2006 |
| JP | 2007-320215 | 12/2007 |
| JP | 2008-311679 | 12/2008 |
| JP | 2011-133942 | 7/2011 |
| JP | 2011-198435 | 10/2011 |

* cited by examiner

*Primary Examiner* — Trong Phan
(74) *Attorney, Agent, or Firm* — Patterson & Sheridan, LLP

(57) ABSTRACT

A control circuit for a nonvolatile semiconductor storage device, during a write operation, configures multiple bit lines so that bit lines that are adjacent to select bit lines are nonselect bit lines. The control circuit applies a first voltage to a write bit line that is included in the select bit lines, and also applies a second voltage that is higher than the first voltage, to a write inhibit bit line that is included in the select bit lines. Then, the control circuit applies a third voltage that is higher than the second voltage to the nonselect bit lines. As a result, the control circuit raises the voltage of the write inhibit bit line, while maintaining the write bit line at the first voltage. Next, the control circuit applies a fourth voltage for the write operation to the drain-side select gate line.

20 Claims, 14 Drawing Sheets

NONVOLATILE SEMICONDUCTOR STORAGE DEVICE

CROSS-REFERENCE TO RELATED APPLICATION

This application is based upon and claims the benefit of priority from Japanese Patent Application No. 2012-136739, filed Jun. 18, 2012; the entire contents of which are incorporated herein by reference.

FIELD

Embodiments described herein relate generally to a nonvolatile semiconductor storage device that can rewrite data electrically.

BACKGROUND

To improve bit density of nonvolatile semiconductor storage devices such as NAND-type flash memory, etc., because miniaturization technology has come close to its limits, stacking of memory cells has become a promising option. As one such example, a stacked NAND-type flash memory in which vertical transistors make up the memory transistor has been proposed. The stacked NAND-type flash memory includes a memory string that is made up of multiple memory transistors that are serially connected in the stacked direction, and select transistors that are installed on both ends of that memory string.

In conventional designs, however, the adjustment of the threshold voltage of the select transistor is not sufficiently done, and the breadth of the threshold voltage distribution is large. Thus, it has not been possible to sufficiently control the performance of select transistors.

SUMMARY

Embodiments provide a nonvolatile semiconductor storage device that can adjust the threshold voltage of select transistors.

In general, according to one embodiment a nonvolatile semiconductor storage device includes a memory string, multiple drain-side select transistors, multiple bit lines, a drain-side select gate line, and a control circuit. The memory string is formed by serially connecting multiple memory transistors that can be rewritten electrically. The multiple drain-side select transistors are each connected at one end thereof to first end parts of the multiple memory strings, and also are configured so that they can adjust a threshold voltage during a write operation. The multiple bit lines are positioned so that they correspond to the multiple memory strings, are parallel to each other, and are respectively connected to other ends of the multiple drain-side select transistors. The drain-side select gate line connects the gates of the multiple drain-side select transistors. The control circuit executes the write operation on the drain-side select transistor by applying a set voltage to the multiple bit lines and the drain-side select gate line. The control circuit, at the time of the write operation, configures the multiple bit lines so that the two sides of the select bit line will be nonselect bit lines. The control circuit applies a first voltage to a write bit line, which is included in the select bit line, and, after applying a second voltage that is higher than the first voltage to the write inhibit bit line, which is included in the select bit line, applies a third voltage that is higher than the second voltage to the non-select bit line. With this, the control circuit, while on the one hand increases the voltage on the write inhibit bit line, maintains the write bit line at the first voltage. Next, the control circuit applies a fourth voltage to the drain-side select gate line that is necessary for the write operation of the drain-side select transistor.

DETAILED DESCRIPTION

One embodiment of the nonvolatile semiconductor storage device will be described, with reference to the figures.

Embodiment 1

Schematic Configuration

Figure 1:
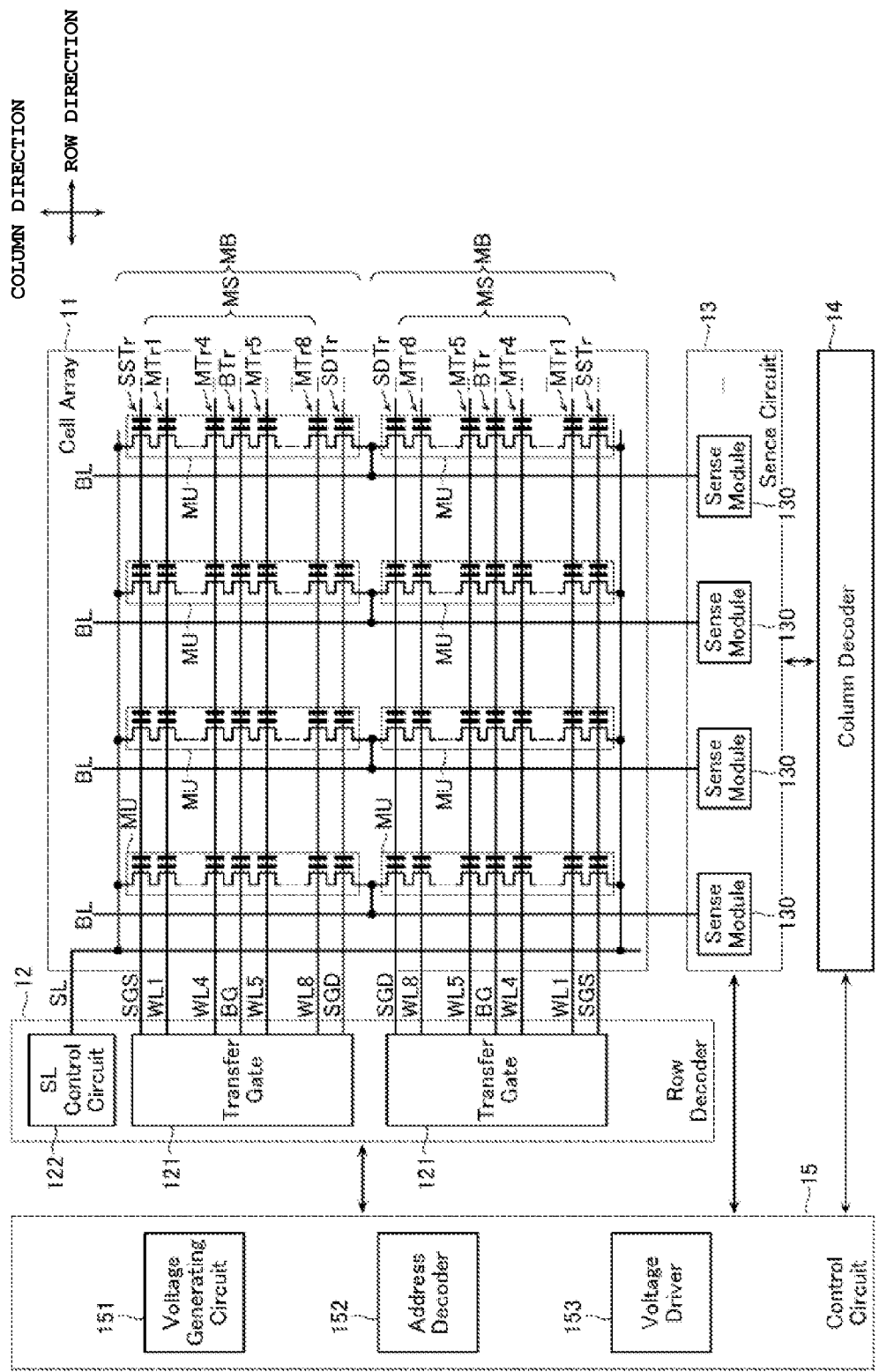
FIG. 1 is a block diagram of a nonvolatile semiconductor storage device according to a first embodiment.

First, a composition of a nonvolatile semiconductor storage device according to Embodiment 1 will be described with reference to FIG. 1. FIG. 1 is a block diagram of the nonvolatile semiconductor storage device according to Embodiment 1.

The nonvolatile semiconductor storage device according to Embodiment 1, as shown in FIG. 1, includes a memory array 11 that stores data, a row decoder 12 that controls a word line WL, etc. of this memory array 11, a sense circuit 13 that senses a bit line BL of the memory array 11 and reads out the data, a column decoder 14 that controls the bit line BL, and a control circuit 15 that controls each of these parts.

The memory array 11, as shown in FIG. 1, includes multiple memory blocks MB that are arrayed in a column direction which is parallel to the substrate. Each block MB is to be a unit for bulk erasing data. Each block MB is composed of multiple memory units MU that are arrayed in a row direction that is parallel to the substrate. Each one end of the multiple memory units MU that are arrayed in the column direction is connected to the common bit line BL. Each of the other ends of the multiple memory units MU that are arrayed in the column direction and the row direction, are connected to a common source line SL within the memory array 11.

The memory unit MU includes a memory string MS and a source-side select transistor SSTr and a drain-side select transistor SDTr that are connected to its two ends.

The memory string MS, as shown in FIG. 1, is composed of memory transistors MTr1 to MTr8 that are serially connected as well as a back gate transistor BTr. The back gate transistor BTr is connected in between the memory transistor MTr4 and the memory transistor MTr5. The memory string MS can include eight or more memory transistors.

The memory transistor MTr1 to MTr8 retains data by changing a threshold voltage (Vth) by accumulating charge in their charge accumulation layers. The back gate transistor BTr enters a conduction state when at least the memory string MS is selected as the target of the action.

To the gates of the multiple memory transistors MTri (i=1 to 8) that are aligned in the row direction within the block MB are mutually connected the word lines WLi (i=1 to 8). Also, to the gate of the multiple back gate transistors BTr that are aligned in the row direction within the block MB are mutually connected the back gate line BG.

The source-side select transistor SSTr is formed in between a source of the memory transistor MTr1 and the source line SL. With the source-side select transistor SSTr, as with the memory transistors MTr1 to MTr8, it is possible to change the threshold voltage by accumulating charge in its charge accumulation layer. To the gate of the multiple source-side select transistors SSTr that are aligned in the row direction are mutually connected a source-side select gate line SGS.

The drain-side select transistor SDTr is formed between the drain of the memory transistor MTr8 and the bit line BL. With the drain-side select transistor SDTr, as with the memory transistors MTr1 to MTr8, it is possible to change the threshold voltage by accumulating charge to their charge accumulation layers. A drain-side select gate line SGD is connected to the gates of the multiple drain-side select transistors SDTr that are aligned in the row direction.

The row decoder 12, based on an address and the data, controls the voltage that is applied to the word lines WL1 to WL8, the source-side select gate line SGS, the drain-side select gate line SGD, and the source line SL. The row decoder 12 includes multiple transfer circuits 121, and one source line control circuit 122. One transfer circuit 121 is provided for one block MB. The transfer circuit 121 controls the voltage that is applied to the word lines WL1 to WL8, the back gate line BG, the source-side select gate line SGS and the drain-side select gate line SGD. The source line control circuit 122 controls the voltage that is applied to the source line SL.

The sense circuit 13, based on the address and the data, controls the voltage of the bit line BL. The sense circuit 13 includes multiple sense modules 130. One sense module 130 is provided for one bit line BL.

The column decoder 14 receives data from the control circuit 15 and provides those data to the sense circuit 13. It also sends the data that are read out from the memory transistors MTr1 to MTr8 with the sense circuit 13 to the control circuit 15.

The control circuit 15 controls the row decoder 12, the sense circuit 13, and the column decoder 14. The control circuit 15 includes a voltage generator circuit 151, an address decoder 152, and a voltage driver circuit 153. The voltage generator circuit 151 generates a set voltage necessary for erasing, writing and reading out of data to/from the memory array 11. The address decoder 152 decodes the address. The voltage driver circuit 153, based on the address, provides a set voltage to the row decoder 12, the sense circuit 13, and the column decoder 14.

(Stacked Structure)

Figure 2:
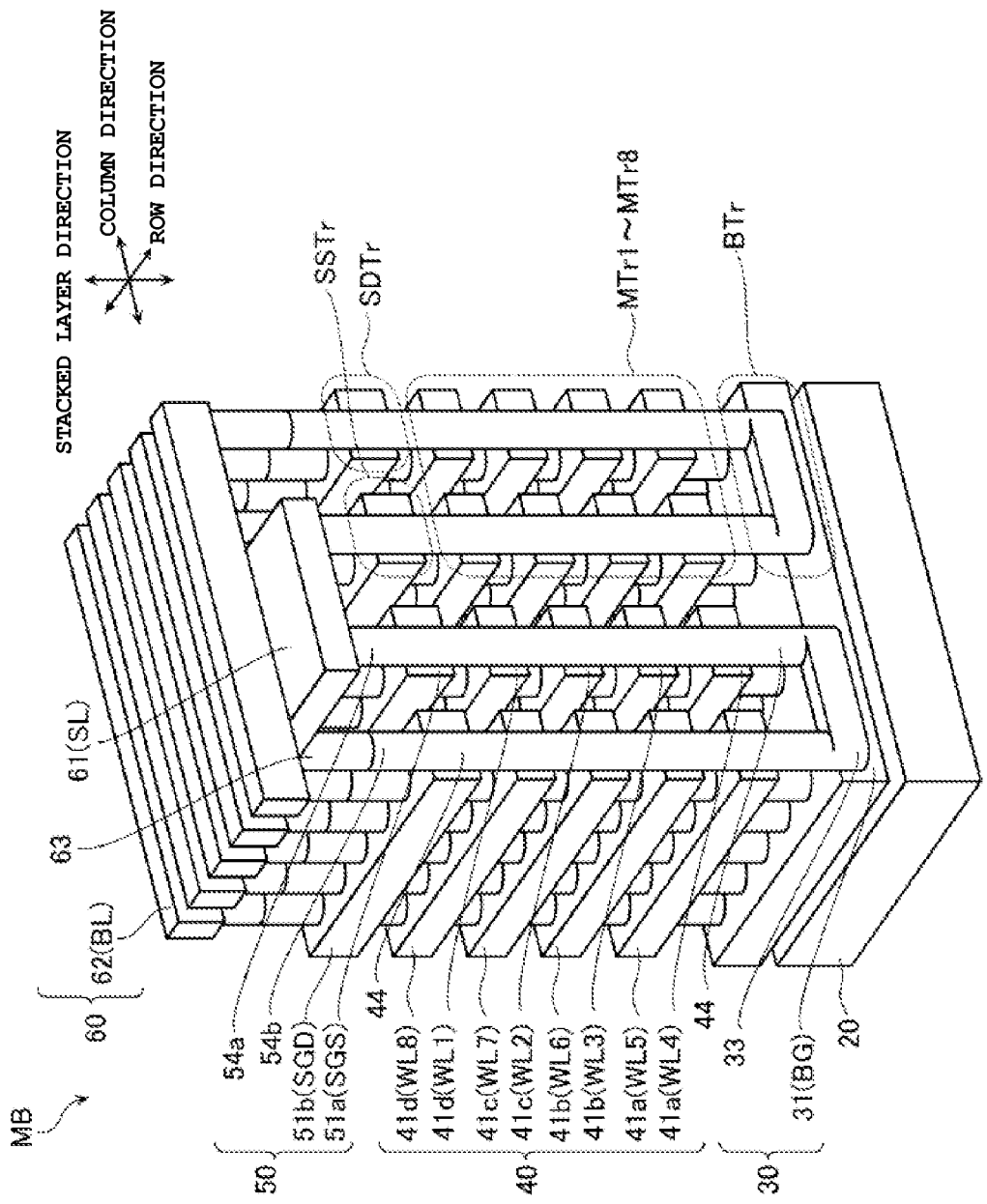
FIG. 2 is an oblique view diagram of a memory block of the first embodiment.
Figure 3:
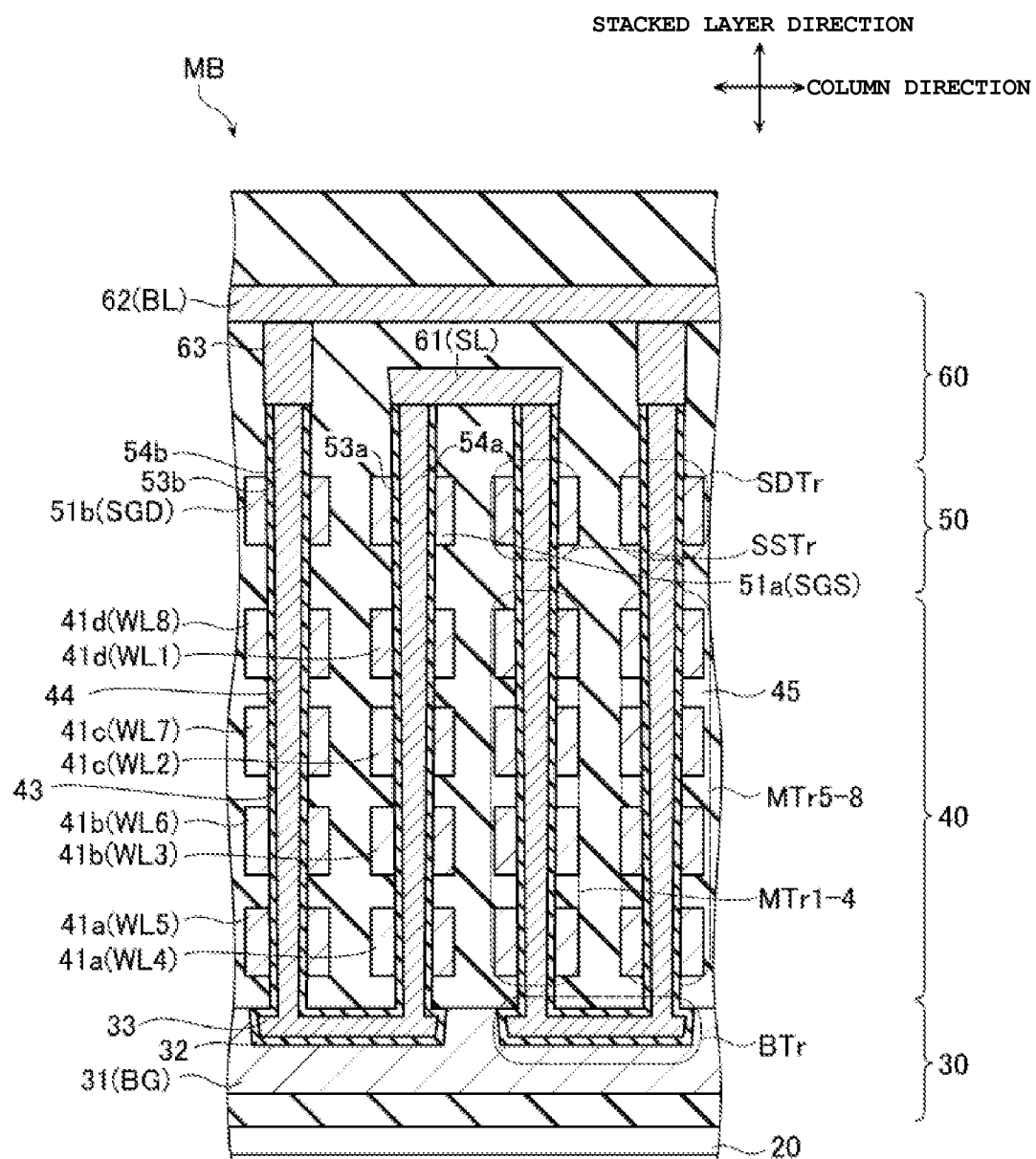
FIG. 3 is a cross-section diagram of the memory block of the first embodiment.

A stacked structure of the block MB will be described in reference to FIG. 2 and FIG. 3. FIG. 2 is a perspective view diagram of the block MB and FIG. 3 is a cross-section diagram of the block MB. The block MB, as shown in FIG. 2 and FIG. 3, is a multilayered structure centered around a U-shaped pipe-type semiconductor layer that extends vertically, and includes a back gate layer 30 that is sequentially stacked on a substrate 20, a memory layer 40, a select transistor layer 50, and a wiring layer 60. The back gate layer 30 functions as the back gate transistor BTr. The memory layer 40 functions as the memory transistor MTr1 to MTr8. The select transistor layer 50 functions as the drain-side select transistor SDTr and the source-side select transistor SSTr. The wiring layer 60 functions as the source line SL and the bit line BL.

The back gate layer 30, as shown in FIG. 2 and FIG. 3, includes a back gate conductive layer 31. The back gate conductive layer 31 functions as the back gate line BG and the gate of the back gate transistor BTr. The back gate conductive layer 31 expands in the row direction and column direction that are parallel to the substrate 20. The back gate conductive layer 31 is, for example, composed of polysilicon (poly-Si).

The back gate layer 30, as shown in FIG. 3, includes a back gate insulating layer 32 and a back gate semiconductor layer 33.

The back gate insulating layer 32 is composed so that charge can be accumulated. The back gate insulation layer 32 is formed between the back gate semiconductor layer 33 and the back gate conductive layer 31. The back gate insulation layer 32 is composed of, for example, silicon dioxide ($SiO_2$), silicon nitride (SiN) and silicon dioxide ($SiO_2$) in a stacked structure.

The back gate semiconductor layer 33 functions as a body (channel) of the back gate transistor BTr. The back gate semiconductor layer 33 is formed so that it digs into the back gate conductive layer 31. The back gate semiconductor layer 33 is composed, for example, of polysilicon (poly-Si).

The memory layer 40, as shown in FIG. 2 and FIG. 3, is formed in an upper layer of the back gate layer 30. The memory layer 40 includes four layers of word line conductive layers 41a to 41d. The word line conductive layer 41a functions as the word line WL4 and the gate of the memory transistor MTr4. Furthermore, the word line conductive layer 41a also functions as the word line WL5 and the gate of the memory transistor MTr5. Similarly, the word line conductive layers 41b to 41d respectively function as the word lines WL1 to WL3 and the gates of the memory transistors MTr1 to MTr3. The word line conductive layers 41b to 41d respectively function as the word lines WL6 to WL8 and the gates of the memory transistors MTr6 to MTr8.

The word line conductive layers 41a to 41d, as shown in FIG. 3, are stacked so that they sandwich an interlayer insulating layer 45 between their upper and lower layers. The word line conductive layers 41a to 41d extend in the row direction (the direction that is perpendicular to the paper in FIG. 3) as its longitudinal direction. The world line conductive layers 41a to 41d, for example, are composed of polysilicon (poly-Si).

The memory layer 40, as shown in FIG. 2 and FIG. 3, includes a memory gate insulating layer 43 and a memory columnar semiconductor layer 44.

The memory gate insulating layer 43 is composed so that it is able to accumulate charge. The memory gate insulating layer 43 is formed in between the memory columnar semiconductor layer 44 and the word line conductive layers 41a to 41d. The memory gate insulating layer 43, for example, is composed of silicon dioxide, silicon nitride, and silicon dioxide in a stacked structure.

The memory columnar semiconductor layer 44 functions as the body (channel) of the memory transistors Mtr1 to MTr8. The memory columnar semiconductor layer 44 penetrates the word line conductive layers 41a to 41d and the interlayer insulating layer 45, and extends in a direction that is perpendicular to the substrate 20. A pair of the memory columnar semiconductor layer 44 is formed so that it fits together near the end parts in the column direction of the back gate semiconductor layer 33. The memory columnar semiconductor layer 44 is composed, for example, of polysilicon (poly-Si).

In the back gate layer 30 and the memory layer 40, one pair of the memory columnar semiconductor layer 44 and the back gate semiconductor layer 33 which connects its bottom end, functions as the body (channel) of the memory string MS, and is formed, seen from the row direction, in a U-shape.

To paraphrase the composition of the back gate layer 30, the back gate conductive layer 31 surrounds the side surface and the bottom surface of the back gate semiconductor layer 33 via the back gate insulating layer 32. To paraphrase the composition of the memory layer 40, the word line conductive layers 41a to 41d surround the side surface of the memory columnar semiconductor layer 44 via the memory gate insulating layer 43.

The select transistor layer 50, as shown in FIG. 2 and FIG. 3, includes a source-side conductive layer 51a and a drain-side conductive layer 51b. The source-side conductive layer 51a functions as the source-side select gate line SGS and the gate of the source-side select transistor SSTr. The drain-side conductive layer 51b functions as the drain-side select gate line SGD and as the gate of the drain-side select transistor SDTr.

The source-side conductive layer 51a is formed in the upper layer of one of the pair of the memory columnar semiconductor layers 44. The drain-side conductive layer 51b is formed in the upper layer of the other of the pair of the memory columnar semiconductor layers 44 that is the same layer as the source-side conductive layer 51a. The multiple source-side conductive layers 51a and drain-side conductive layers 51b are placed in the column direction with a set pitch, and extend in the row direction. The source-side conductive layer 51a and the drain-side conductive layer 51b are composed, for example, of polysilicon (poly-Si).

The select transistor layer 50, as shown in FIG. 2 and FIG. 3, includes a source-side gate insulating layer 53a, a source-side columnar semiconductor layer 54a, a drain-side gate insulating layer 53b, and a drain-side columnar semiconductor layer 54b. The source-side columnar semiconductor layer 54a functions as the body (channel) of the source-side select transistor SSTr. The drain-side columnar semiconductor layer 54b functions as the body (channel) of the drain-side select transistor SDTr.

The source-side gate insulating layer 53a is composed so that it can accumulate charges. The source-side gate insulating layer 53a is formed between the source-side conductive layer 51a and the source-side columnar semiconductor layer 54a. The source-side gate insulating layer 53a is composed of, for example, silicon dioxide, silicon nitride, and silicon dioxide in a stacked structure.

The source-side columnar semiconductor layer 54a penetrates the source-side conductive layer 51a and extends in a direction that is perpendicular to the substrate 20. The source-side columnar semiconductor layer 54a is connected to the side surface of the source-side gate insulating layer 53a and the top surface of one of the pair of the memory columnar semiconductor layers 44. The source-side columnar semiconductor layer 54a is composed of, for example, polysilicon (poly-Si).

The drain-side gate insulating layer 53b is composed so that it can accumulate charge. The drain-side gate insulating layer 53b is formed between the drain-side conductive layer 51b and the drain-side columnar semiconductor layer 54b. The drain-side gate insulating layer 53b is composed of, for example, silicon dioxide, silicon nitride, and silicon dioxide in a stacked structure.

The drain-side columnar semiconductor layer 54b penetrates the drain-side conductive layer 51b and extends in the direction that is perpendicular to the substrate 20. The drain-side columnar semiconductor layer 54b is connected to the side surface of the drain-side gate insulating layer 53b and the top surface of the other of the pair of memory columnar semiconductor layers 44. The drain-side columnar semiconductor layer 54b is composed of, for example, polysilicon (poly-Si).

The wiring layer 60 includes a source line layer 61, a bit line layer 62, and a plug layer 63. The source line layer 61 functions as the source line SL and the bit line layer 62 functions as the bit line BL.

The source line layer 61 contacts the top surface of the source-side columnar semiconductor layer 54a, and extends in the row direction. The bit line layer 62 contacts the top surface of the drain-side columnar semiconductor layer 54b via the plug layer 63 and extends in the column direction. The source line layer 61, the bit line layer 62, and the plug layer 63 are composed of, for example, metals such as tungsten, etc.

Figure 4:
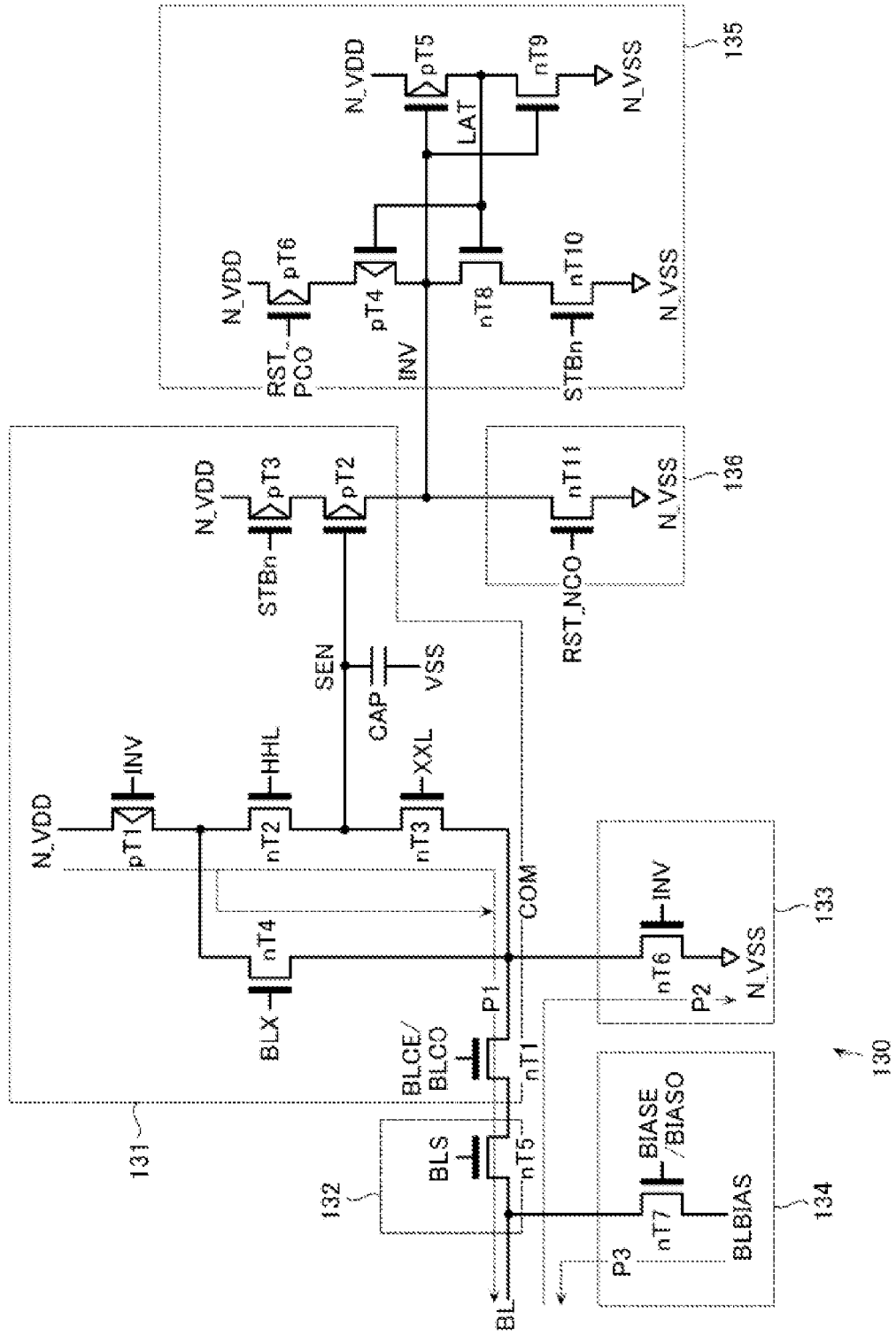
FIG. 4 is a schematic circuit diagram that shows a sense module of the first embodiment.

Next, the composition of the sense module 130 will be described in detail with reference to FIG. 4. FIG. 4 is a schematic circuit diagram that shows the sense module 130. As shown in FIG. 4, the sense module 130 possesses a sense amplifier 131, a bit line select circuit 132, a pulldown circuit 133, a non select bit line bias circuit 134, a latch 135, and a reset circuit 136.

The sense amplifier 131 provides a power supply voltage Vdd to the bit line BL. In the sense amplifier 131, one end of the current pathway of a clamp transistor nT1 is connected to the bit line BL via the bit line select circuit 132, which doubles as the protection circuit, and the other end is connected to a node COM. The gate of the clamp transistor nT1 that is connected to the odd-numbered bit line BL receives a signal BLCO, and a gate of the clamp transistor nT1 that is connected to the even-numbered bit line BL receives the signal BLCE. The signals BLCE/BLCO, when the odd-numbered bit line BL is made the select bit line BL, and the even numbered bit line BL is made the nonselect bit line BL, is made so that the clamp transistor connected to the odd-numbered bit line BL transfers the voltage that is decided based on the voltage of the signal BLCO to the bit line BL, and the clamp transistor nT1 that is connected to the even numbered bit line BL is configured so that it is in the off-state. Alternately, the signals BLCE/BLCO, when the even-numbered bit line BL is made the select bit line BL, and the odd numbered bit line BL is made the nonselect bit line BL, is made so that the clamp transistor that is connected to the even-numbered bit line BL transfers the voltage that is decided based on the voltage of the signal BLCE to the bit line BL, and the clamp transistor nT1 that is connected to the odd numbered bit line BL is configured so that it is in the off-state.

The capacitor CAP is connected to a sense node SEN. Between a power supply node N_VDD and the sense node SEN are serially connected a pMOS transistor pT1 and a MOS transistor nT2 used for the recharge and is driven by a signal HLL. Between the sense node SEN and the node COM, a MOS transistor nT3 used for charge-transfer is connected. Between the pMOS transistor pT1 and the node COM is connected a MOS transistor nT4 which is used for continued supply of electrical current. Each of the gates of these MOS transistors pT1, nT2, nT3, and nT4 is provided with the signal from a node INV, a signal HHL, a signal XXL, and a signal BLX.

The MOS transistor nT2 whose gate is connected to the sense node SEN and the MOS transistor nT3 that is connected in between the MOS transistor pT2 and the power source node N_VDD, compose a discriminator circuit that discriminates a level of the sense node SEN. An output of this discriminator circuit is input to the node INV of a latch 135. Meanwhile, the gate of the MOS transistor npT3 is provided with a strobe signal STBn.

The bit line select circuit 132 connects the bit line BL and the sense amplifier 131 and includes an nMOS transistor nT5, which is designed to be high-voltage so that it protects the sense amplifier 131 from the high voltage that can be applied by the bit line BL. The nMOS transistor nT5 is connected between the clamp transistor nT1 and the bit line BL, and its gate is provided with the signal BLS.

The pulldown circuit 133, based on the data retained by the latch 135, grounds the bit line BL. The pulldown circuit 133 is composed of an nMOS transistor nT6 that is connected between the node COM and an earth terminal N_VSS. A gate of the MOS transistor nT6 is provided with data retained by the node INV of the latch 135.

The nonselect bit line bias circuit 134 that is connected to the odd numbered bit line BL, is turned on/off by a signal BIASO. The nonselect bit line bias circuit 134 that is connected to the even numbered bit line BL is turned on/off by the signal BIASE, and is composed of an nMOS transistor nT7, whose one end is connected to the bit line BL and the other end is provided with the signal BLBIAS. The signals BIASE/BIASO, when the odd numbered bit line BL is made the select bit line BL and the even numbered bit line BL is made the nonselect bit line BL, are configured so that an nMOS transistor nT7 that is connected to the odd numbered bit line BL is in the off state, and the nMOS transistor nT7 that is connected to the even numbered bit line BL is in the on state. The signals BIASE/BIASO, when the even numbered bit line BL is made the select bit line BL and the odd numbered bit line BL is made the nonselect bit line BL, are configured so that the nMOS transistor nT7 that is connected to the even numbered bit line BL is in the off state, and the nMOS transistor nT7 that is connected to the odd numbered bit line BL is in the on state.

The latch 135 retains data in the node INV and LAT which are mutually reverse in logic levels. The latch 135 is composed by cross coupling an inverter that is composed of MOS transistors pT4 and nT8, that are connected as complementary pairs, between the power source node N_VDD and the earth terminal N_VSS, and an inverter that is similarly composed of MOS transistors pT5 and nT9. To the MOS transistors pT4 and nT8 are serially connected MOS transistors pT6 and nT10. To each of the gates of the MOS transistors pT6 and nT10 is provided a reset signal RST_PCO and strobe signal STBn.

The reset circuit 136 grounds the node INV based on the signal RST_NCO. The reset circuit 136 is composed of an nMOS transistor nT11 that is connected between the MOS transistor pT2 and the ground terminal N_VSS. The gate of the MOS transistor nT11 is provided with the signal RST_NCO.

Next, the method for controlling the threshold voltage of the drain-side select transistor SDTr will be described. Normally, when verifying writing to the memory transistor, the voltage of bit line BL that is connected to the select memory transistor, which conducts the writing, is made Vss, the ground voltage, and at the same time, the voltage of bit line BL that is connected to the select memory transistor to which writing is inhibited after writing is finished, is made Vb1 that is higher than Vss. The same voltage Vb1 is applied to the drain-side select transistor SDTr of the memory unit MU. Then, write voltage Vpgm is applied to the select memory transistor, and the pass voltage Vpass is applied to the nonselect memory transistor. At the write memory unit MU, since the drain-side select transistor SDTr is on, the voltage Vss of the bit line BL is transferred to the channel and writing is done. On the other hand, at the write-inhibited memory unit, since the drain-side select transistor SDTr is cut off, with the coupling with the gate of the memory transistor, the channel potential rises, and writing is not done. The selection of write/write-inhibit of the select memory transistor is carried out by the on/off of the drain-side select transistor SDTr. However, in the case of conducting the write on the drain-side select transistor SDTr itself, because it cannot make that kind of selection, a bulk write has to be done by the entire block MB. For this reason, it is difficult to precisely adjust the threshold value of the drain-side select transistor SDTr. On the other hand, if a write voltage/write inhibit voltage is applied to each bit line BL according to the data, it is possible to configure the write inhibit state after writing is finished, but in this case, as stated below, an enormous amount of area for the circuit will be required.

Figure 5:
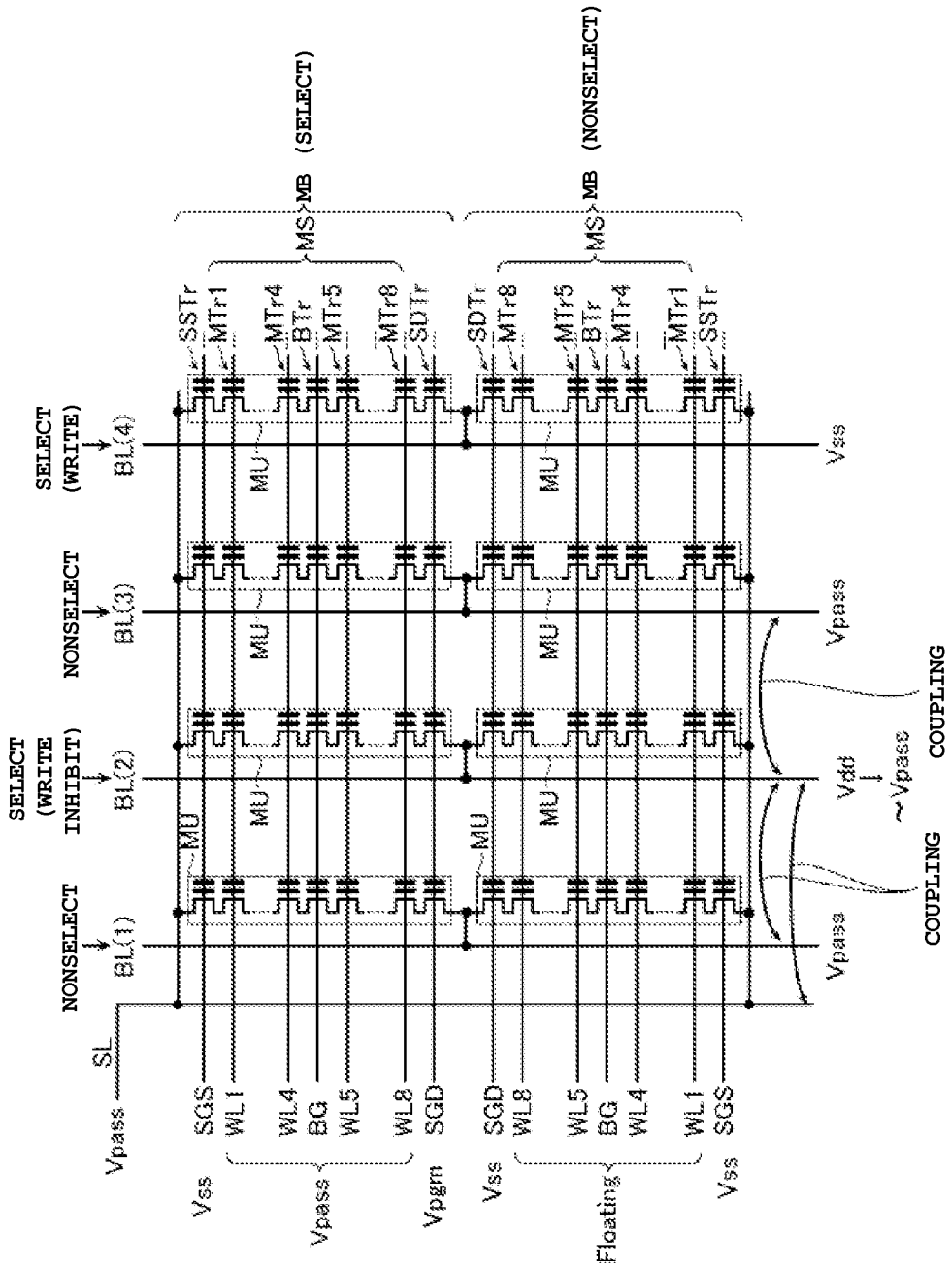
FIG. 5 is a schematic diagram that shows a write operation of a drain-side select transistor of the first embodiment.
Figure 6:
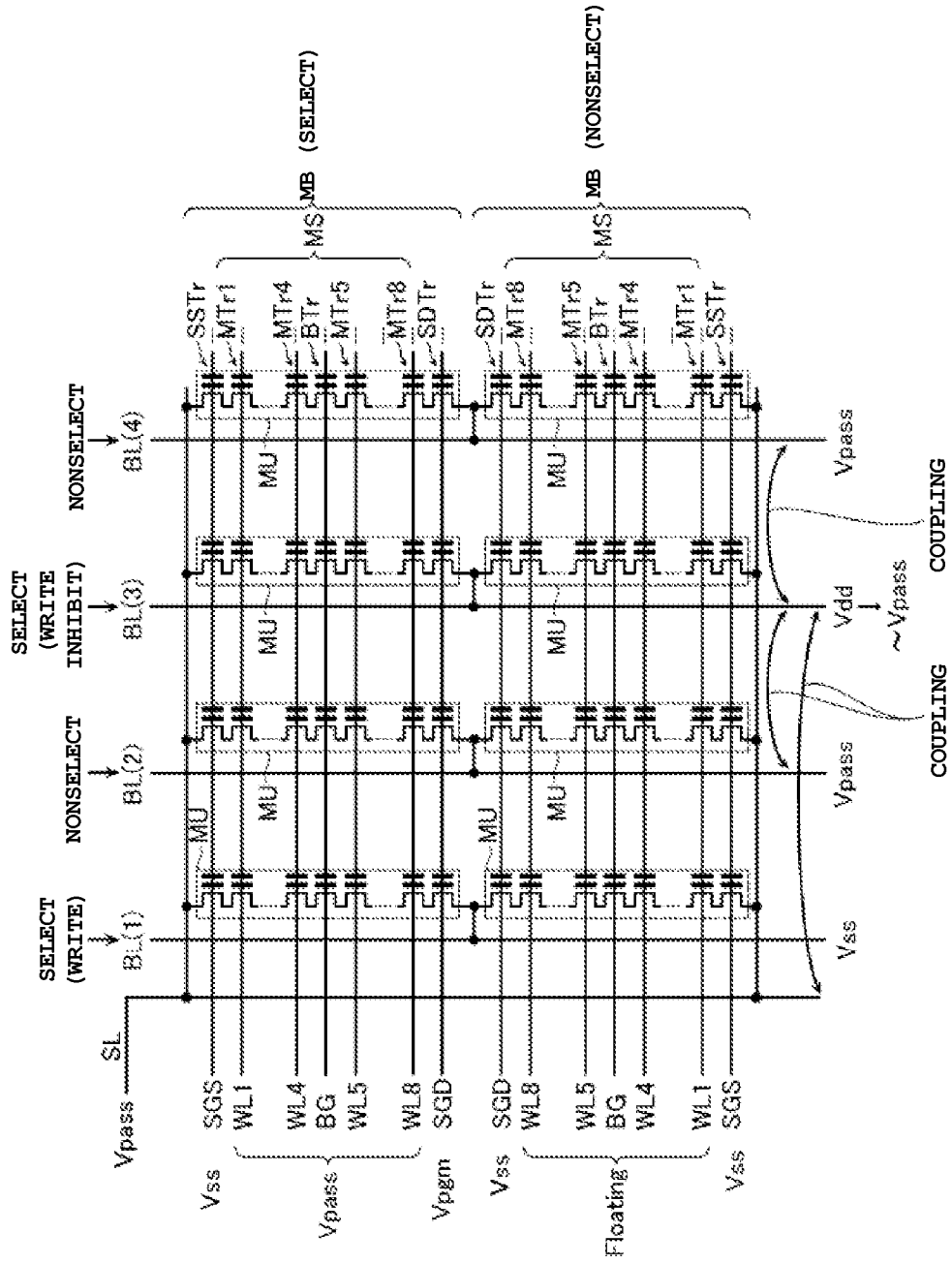
FIG. 6 is a schematic diagram that shows the write operation of the drain-side select transistor of the first embodiment.

Therefore, in this embodiment, verify writing of the drain-side select transistor SDTr is executed without bringing on such an increase in the circuit dimension. Below, the write operation that controls the threshold distribution of the drain-side select transistor SDTr in the appropriate positions is described. FIG. 5 and FIG. 6 are schematic diagrams that show the write operation of the drain-side select transistor SDTr.

First, as shown in FIG. 5, the even numbered bit lines BL (2), BL (4) shall be select bit lines BL (2), BL (4) and the odd numbered bit lines BL (1), BL (3) shall be the nonselect bit lines BL (1), BL (3). The drain-side select transistor SDTr that is connected to the select bit lines BL (2), (4) will be the target of the write operation, and the drain-side select transistor SDTr that is connected to the nonselect bit lines BL (1), (3) will not be the target of the write operation.

Subsequently, as shown in FIG. 6, the relationship between the select bit line BL and the nonselect bit line BL in FIG. 5 is reversed. The odd numbered bit lines BL (1), BL (3) will be the select bit lines BL (1), BL (3), and the even numbered bit lines BL (2), BL (4) will be the nonselect bit lines BL (2), BL (4). Thus, as shown in FIG. 5 and FIG. 6, this embodiment executes the write operation on the drain-side select transistor SDTr by alternately selecting the even numbered and the odd numbered bit lines BL (1) to BL (4).

Furthermore, this embodiment conducts a verify action after the write operation. In the verify action, whether or not the threshold voltage of the drain-side select transistor SDTr has reached the set value is determined. Based on this determination result, a write operation is executed again on the drain-side select transistor SDTr for which the threshold voltage has not reached the set value, and write operation is inhibited for the drain-side select transistor SDTr for which the threshold voltage has reached the set value. Thus, this embodiment adjusts the position and width of the threshold voltage distribution of the drain-side select transistor SDTr.

Next, the action shown in FIG. 5 is described specifically. In FIG. 5, an example is shown where, of the select bit lines BL (2) and BL (4), the select bit line BL (2) is made the write inhibit bit line BL (2) which inhibits the write operation of the drain-side select transistor SDTr, and the select bit line BL (4) is made the write bit line BL (4) which executes the write operation on the drain-side select transistor SDTr.

In this case, as shown in FIG. 5, the write inhibit bit line BL (2) is supplied with the power source voltage Vdd, and the write bit line BL (4) is grounded and its voltage shall be the ground voltage Vss. After transferring voltage to the select bit lines BL (2), (4), the signal BLS is lowered to the power source voltage Vdd, and then the voltage of the nonselect bit lines BL (1) and BL (3), as well as the voltage of the source line SL is made the pass voltage Vpass. Then, due to the coupling with the nonselect bit lines BL (1), BL (3) and the pass voltage Vpass of the source line SL, the voltage of the write inhibit bit line BL (2) increases. As a result, because the clamp transistor nT1 in FIG. 4 which is connected to the write inhibit bit line BL (2) enters the off state, the write inhibit bit line BL (2) enters a floating state (Floating), and its voltage rises to the vicinity of the pass voltage Vpass. On the other hand, the voltage of the write bit line BL (4) will be maintained at the ground voltage Vss. Meanwhile, by raising the voltage of the source line to the pass voltage Vpass as in the above, there is, besides the boost acceleration effect, the advantage that the leak from the write inhibit bit line BL to the source line SL can be suppressed.

Furthermore, as shown in FIG. 5, the voltage of the word lines WL1 to WL8 within the select block MB and the voltage of the back gate line BG are made the pass voltage Vpass. Within the select block MB, the voltage of the source-side select gate line SGS is made the ground voltage Vss, and the voltage of the drain-side select gate line SGD is made the program voltage Vpgm.

With the controls above, a large potential difference occurs between the body and the gate of the drain-side select transistor SDTr that is connected to the write bit line BL (4) within the select block MB. Due to this, a write operation is executed on that drain-side select transistor SDTr.

Alternately, due to the controls above, a large potential difference does not occur between the body and the gate of the drain-side select transistor SDTr that is connected to the write inhibit bit line BL (2) and the nonselect bit lines BL (1) and BL (3) within the select block MB. Due to this, write operations are inhibited on that drain-side select transistor SDTr.

Meanwhile, as shown in FIG. 5, within the nonselect block MB, the word lines WL1 to WL8 are in a floating state. Furthermore, the voltages of the source-side select gate line SGS and the drain-side select gate line SGD will be the ground voltage Vss. With this, write operation is not executed at the nonselect block MB. When this write operation is finished, the verify action is executed, and when the verify action passes, the L level is retained in the node INV of the latch 135 in FIG. 4.

Next, the action shown in FIG. 6 will be described specifically. In the example that is shown in FIG. 6, the select bit line BL (1) is made the write bit line BL (1), and the select bit line BL (3) is made the write inhibit bit line BL (3). Other than that, in FIG. 6, the voltage that is applied to the bit lines BL (1) to BL (4), the source line SL, the word lines WL1 to WL8, the back gate line BG, the source-side select gate line SGS and the drain-side select gate line SGD is the same as shown in FIG. 5, and so their descriptions are omitted.

Figure 7:
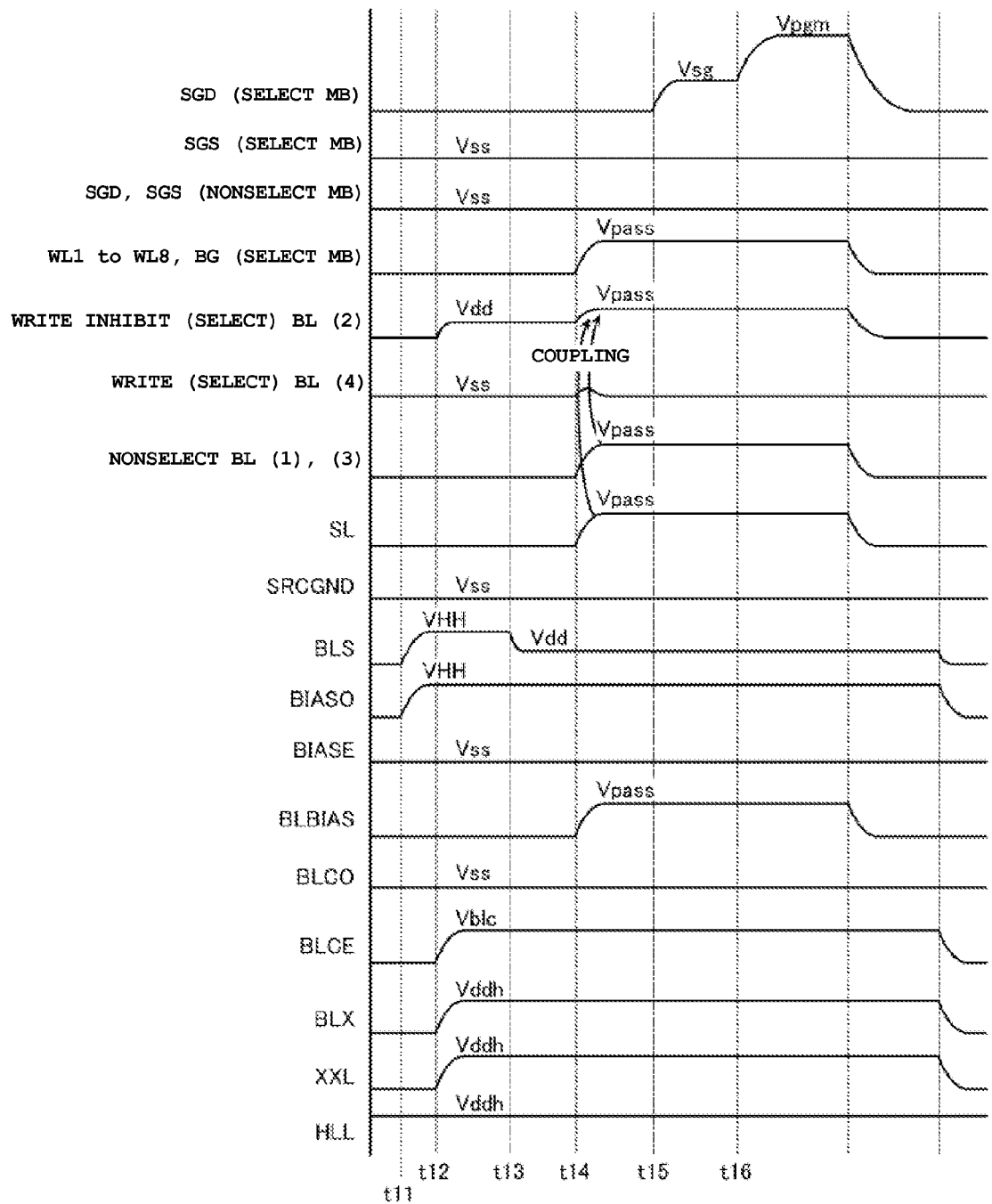
FIG. 7 is a timing chart for the various signals during the write operation of the drain-side select transistor of the first embodiment.

The timings of the various signals when executing the control shown in FIG. 5 will be described here, with reference to FIG. 4 and FIG. 7. FIG. 7 is a timing chart for the various signals during the write operation of the drain-side select transistor SDTr. As shown in FIG. 7, first, at time t11, the voltage of the signal BLS and the signal BIASO is raised to the voltage VHH. Simultaneously, at time t11, the voltage of the signal BIASE is maintained at the ground voltage Vss. Next, at time t12, the voltages of the signals BLX and XXL are each raised to voltage Vddh, and the voltage of the signal BLCE is raised to the voltage Vb1c. Also, at time t12, the voltage of the signal BLCO is maintained at the ground voltage Vss.

Here, as shown in FIG. 4, within the sense module 130 that corresponds to the write inhibit bit line BL (2), based on the data retained in the node INV of the latch 135, the MOS transistor nT6 is maintained in a nonconductive state. Therefore, due to the controls at times t11 and t12, as shown in a path P1 in FIG. 4, the write inhibit bit line BL (2) is connected to the power source node N_VDD via the clamp transistor nT1, and MOS transistors pT1, nT2 to nT5, and is charged to the power source voltage Vdd.

Meanwhile, within the sense module 130 that corresponds to the write bit line BL (4), and based on the data retained in the node INV of the latch 135, the MOS transistor nT6 enters a conductive state. Therefore, after the controls at the times t11 and t12, as shown in a path P2 in FIG. 4, the write bit line BL (4) is grounded via the clamp transistor nT1 and MOS transistors nT5 and nT6, and its voltage is made the ground voltage Vss.

As shown in FIG. 7, at time t13, the voltage of the signal BLS is lowered to the power source voltage Vdd. This happens, after time t13 when the voltage of the bit line BL is raised to around the voltage of the pass voltage Vpass, in order to prevent that high voltage from being transferred to the clamp transistor nT1. By keeping the voltage of the signal BLS down at the power source voltage Vdd, only the voltage Vdd–Vtn (the threshold voltage of the nMOS transistor nT5) is transferred to the clamp transistor nT1.

At time t14, the voltage of the signal BLBIAS is raised to the pass voltage Vpass. At this time, since the voltage of the signal BIASO is made the voltage VHH, within the sense module 130 that corresponds to the nonselect bit lines BL (1) and (3), the MOS transistor nT7 enters a conductive state. Therefore, as shown in a path P3 in FIG. 4, the nonselect bit lines BL (1) and BL (3) are provided with the pass voltage Vpass via the MOS transistor nT7.

Also shown in FIG. 7, at time t14, the voltage of the source line SL is raised to the pass voltage Vpass. Since the voltage of the write inhibit bit line BL(2) rises due to the coupling that comes with the pass voltage Vpass of these nonselect bit lines BL (1), BL (3) and the source line SL, the clamp transistor nT1 that is connected to the write inhibit bit line BL (2) enters a cutoff state. Due to this, the write inhibit bit line BL (2) enters a floating state, and due to the coupling with the nonselect bit line BL (1), BL (3) and the source line SL, the voltage of the write inhibit bit line BL (2) is raised to around the pass voltage Vpass.

Also at time t14, the voltages of the word lines WL1 to WL8 within the select block MB and the back gate BG are raised to the pass voltage Vpass.

At time t15, the voltage of the drain-side select gate line SGD within the select block MB is raised to the voltage Vsg, and further, at time t16 is raised to the program voltage Vpgm. With this, the write operation is executed on the drain-side select transistor SDTr that is connected to the write bit line BL (4) within the select block MB.

Here, as mentioned above, a comparative example will be considered in which a pass voltage Vpass is applied to the write inhibit bit line BL and at the same time a ground voltage Vss is applied to the write bit line BL according to the data, and a write operation is done at once on the even numbered and odd numbered bit lines BL. In this comparative example, according to the data of the latch 135 in FIG. 4, the write/write inhibit of the bit line BL is configured, and the write bit line BL is applied with the ground voltage Vss, and the write inhibit bit line BL is applied with the pass voltage Vpass. Thus, a level shifter for applying the pass voltage Vpass to the write inhibit bit line BL, which is decided by the data of the latch 135, will be necessary for each sense module 130. However, the level shifters take up a large area, and if the same number of them is provided as there are bit lines BL, they will require an enormous amount of area on the circuit. Therefore, this embodiment has a composition, of not only the composition of the comparative example, but also one in which the pass voltage Vpass is applied at once to the even numbered and to the odd numbered nonselect bit lines BL via the nMOS transistor nT7. Also, with this embodiment, the voltage of the write inhibit bit line BL, which is made floating due to the coupling with the nonselect bit line BL, is raised to around the pass voltage Vpass. In this case, the level shifter is not needed for every sense module, and the occupied area of this embodiment can be made smaller than that for the comparative example.

Embodiment 2

Next, the composition of the nonvolatile semiconductor storage device and its behavior according to Embodiment 2 will be described. Here, in Embodiment 1, as shown in FIG. 5, the voltage of the source-side select gate line SGS is configured to be the ground voltage Vss, and the voltage of the source line SL is configured to be the pass voltage Vpass. Therefore, the GIDL current arises near the source of the source-side select transistor SSTr due to the voltages Vpass and Vss that are applied to the source and the gate of these source-side select transistors SSTr, and a false operation can occur.

Also, as shown in FIG. 5, within the select block MB, the drain of the memory transistor MTr8 is provided with the pass voltage Vpass from the nonselect bit line BL via the drain-side select transistor SDTr. So, it is also possible to make the voltage of the word line WL8 within the select block MB the ground voltage Vss, and to cutoff the leak current from the source-side select transistor SSTr at the memory transistor MTr8. Specifically, the write inhibit bit line BL is made floating, and the voltage is raised by coupling with the adjacent bit line BL. Thus, when all the channels of the drain-side select transistor SDTr that is connected to the write inhibit bit line BL are in the conductive state, and the capacity of the word line WL of that channel is seen, the boost efficiency declines, and as a result, the voltage of the bit line BL may not rise sufficiently. In such a case, a cutoff at the memory transistor MTr8 is effective. However, in the case above, due to the voltages Vpass and Vss that are applied to the drain and the gate of the memory transistor MTr8 within the select block MB, the GIDL current could occur near the drain of the memory transistor MTr8.

Furthermore, as shown in FIG. 5, the voltage of the drain-side select gate line SGD within the nonselect block MB is made the ground voltage Vss, and the voltage of the nonselect bit lines BL (1) and (3) are made the pass voltage Vpass. Therefore, due to the voltages Vpass and Vss that are applied to the drain and the gate of the drain-side select transistor SDTr within these nonselect blocks MB, the GIDL current can occur near the drain of the drain-side select transistor SDTr.

Figure 8:
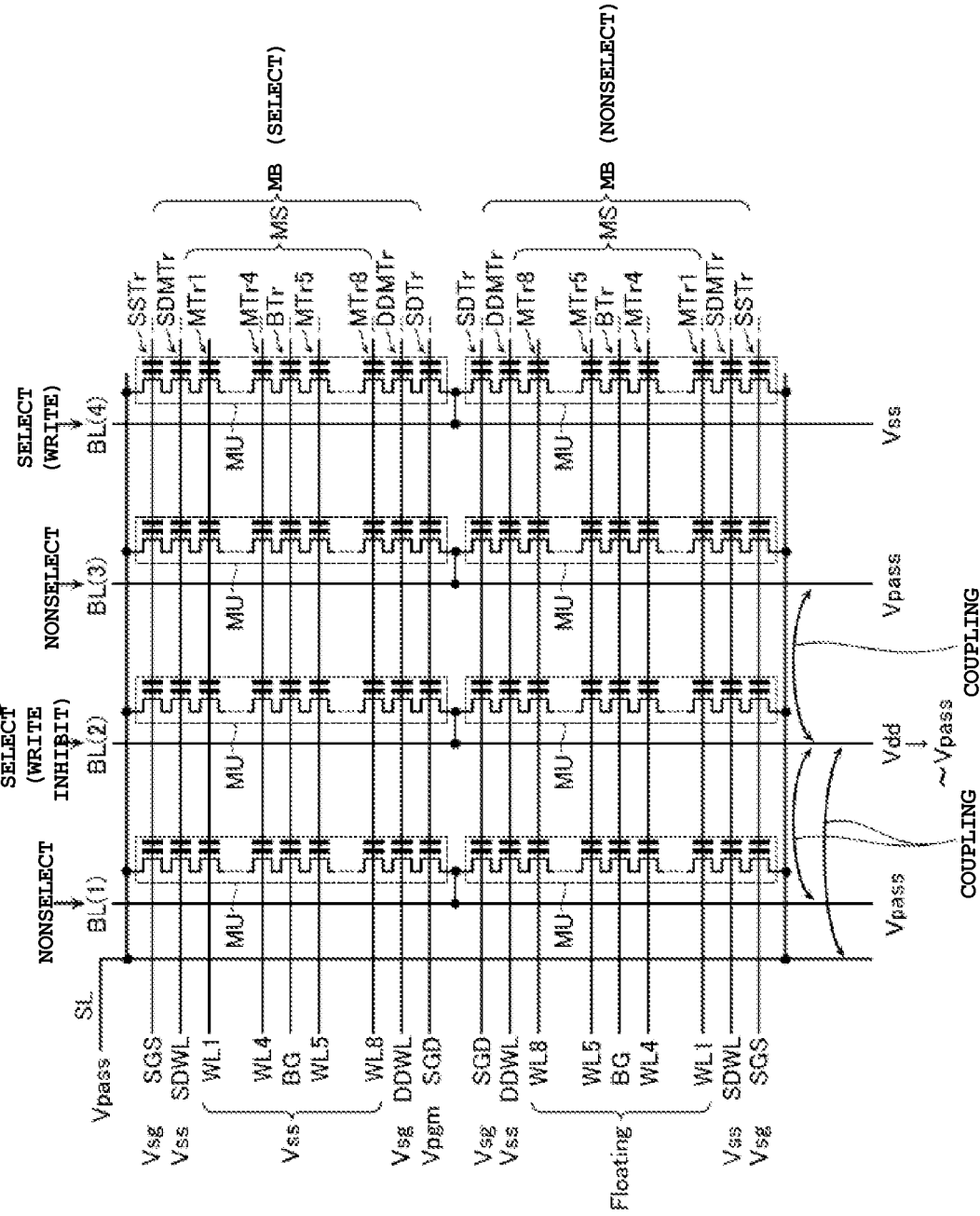
FIG. 8 is a diagram showing an overview of a composition of a memory array and a write operation on a drain-side select transistor according to a second embodiment.

With these problems in mind, as shown in FIG. 8, Embodiment 2 includes the memory unit MU that has a form differing from that of Embodiment 1. FIG. 8 is the diagram showing an overview of the composition of the memory array 11 and the write operation on the drain-side select transistor SDTr according to Embodiment 2. The memory unit MU according to Embodiment 2, as shown in FIG. 8, includes, in addition to the composition of Embodiment 1, a memory transistor (henceforth, source-side dummy transistor SDMTr and the drain-side dummy transistor DDMTr) that can be used as a normal memory transistor as well as a dummy transistor. The source-side dummy transistor SDMTr is formed between the memory string MS and the source-side select transistor SSTr, and the drain-side dummy transistor DDMTr is formed between the memory string MS and the drain-side select transistor SDTr. A source-side dummy word line SDWL is connected to the gates of the multiple source-side dummy transistors SDMTr that are arrayed in the row direction. A drain-side dummy word line DDWL is connected to the gates of the multiple drain-side dummy transistors DDMTr that are arrayed in the row direction.

In Embodiment 2 having the composition described above, when executing the write operation on the drain-side select transistor SDTr that is connected to the even numbered select bit lines BL (2) and BL (4), the various wirings are controlled as shown in FIG. 8. As shown in FIG. 8, the voltages that are applied to the bit line BL, source line SL, and the drain-side select gate line SGD within the select block MB, are the same as in Embodiment 1.

On the other hand, within the select block MB of Embodiment 2, the voltages of the word lines WL1 to WL8 and the back gate line BG are configured to be the ground voltage Vss. The voltage of the source-side select gate SGS within the select block MB is configured to be the voltage Vsg, which is larger than the ground voltage Vss and at the same time smaller than the pass voltage Vpass (Vss<Vsg<Vpass), and the occurrence of the GIDL current at the source-side select transistor SSTr is suppressed. Furthermore, in the select block MB, the voltage of the source-side dummy word line SDWL is configured to be the ground voltage Vss, and the source-side dummy transistor SDMTr is made to be in a nonconductive state. With this, the leak current from the source-side select transistor SSTr is cutoff at the source-side dummy transistor SDMTr. In the select block MB, the voltage of the drain-side dummy word line DDWL is configured to be the voltage Vsg, and the occurrence of the GIDL current at the drain-side dummy transistor DDMTr is suppressed. Since, due to the drain-side dummy transistor DDMTr, a voltage that is smaller than the pass voltage Vpass is supplied to the drain of the memory transistor MTr8, and the occurrence of the GIDL current at the memory transistor MTr8 is suppressed.

In the nonselect block MB of Embodiment 2, the voltages of the source-side select gate line SGS and the drain-side select gate line SGD are configured to be the voltage Vsg. With this, the occurrence of the GIDL current at the source-side select transistor SSTr and the drain-side select transistor SDTr is suppressed. In the nonselect block MB, the voltages of the source-side dummy word line SDWL and the drain-side dummy word line DDWL are configured to be the ground voltage Vss, and the source-side dummy transistor SDMTr and the drain-side dummy transistor DDMTr are put into a nonconductive state. With this, the leak current from the source-side select transistor SSTr and the drain-side select transistor SDTr are cutoff at the source-side dummy transistor SDMTr and the drain-side dummy transistor DDMTr.

Figure 9:
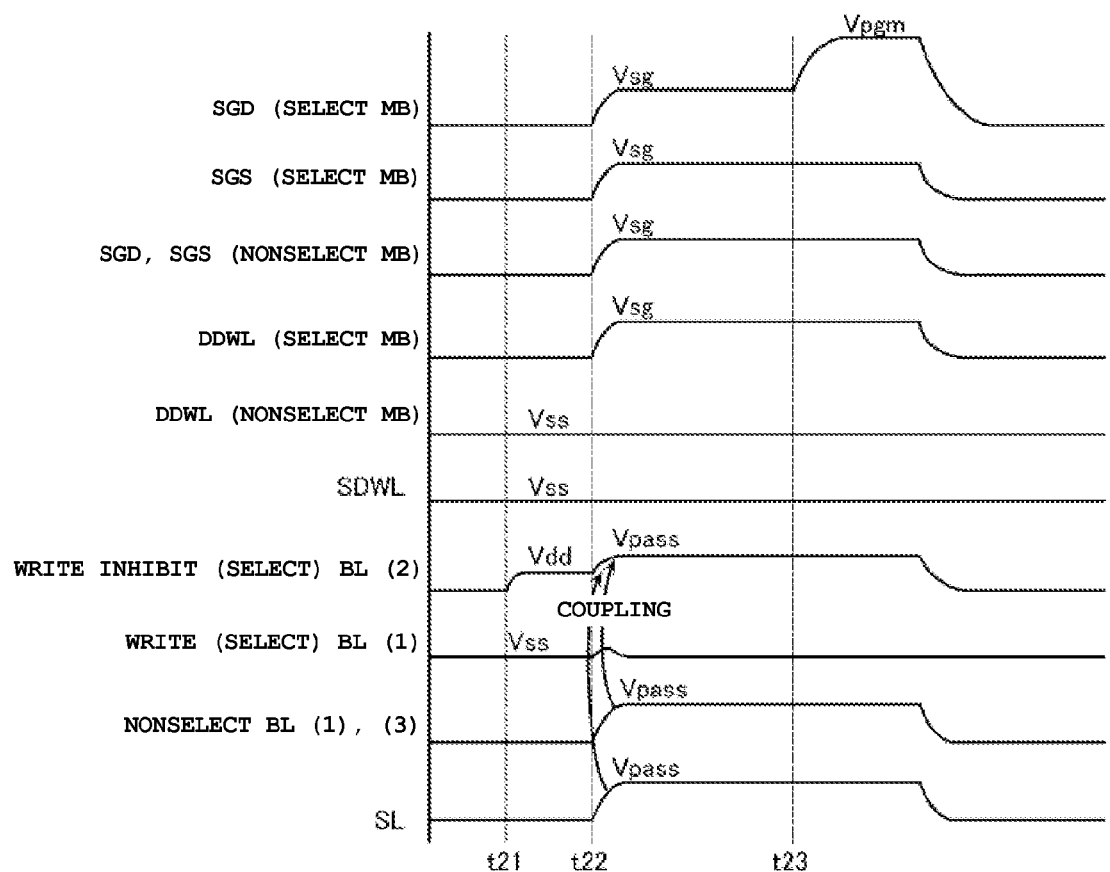
FIG. 9 is a timing chart for the various signals during the write operation of the drain-side select transistor of the second embodiment.

Next, the timings of the various signals when executing the controls shown in FIG. 8 will be described with reference to FIG. 9. FIG. 9 is a timing chart for the various signals during the write operation of the drain-side select transistor SDTr. In FIG. 9, descriptions for those controls that are the same as Embodiment 1 will be partially omitted. As shown in FIG. 9, first, at time t21, the voltage of the write inhibit bit line BL (2) is raised to the power source voltage Vdd. At time t22, the voltages for the nonselect bit lines BL (1), (3) and the source line SL are raised to around the pass voltage Vpass. Due to the coupling as a result of this, the voltage of the write inhibit bit line BL (2) is raised to around the pass voltage Vpass. Also at time t22, the voltages of the source-side select gate line SGS and the drain-side select gate line SGD are raised to the voltage Vsg, and the voltage of the drain-side dummy word line DDWL within the select block MB is also raised to the voltage Vsg. At time t23, the voltage of the drain-side select gate line SGD within the select block MB is raised to the program voltage Vpgm. With the above, the write operation on the drain-side select transistor SDTr is executed.

Embodiment 3

Next, the nonvolatile semiconductor storage device according to Embodiment 3 will be described. In the embodiment, after executing the write operation on the drain-side select transistor SDTr that is connected to the even numbered select bit lines BL (2) and BL (4), the write operation is executed on the drain-side select transistor SDTr that is connected to the odd numbered select bit lines BL (1) and BL (3). In the case that most of the threshold distribution of the drain-side select transistor SDTr has reached the desired threshold level at the process stage, there is no problem; but in the case that it has not, almost all of the drain-side select transistor SDTr become the target of the write operation during the first stages of the write operation. Therefore, the even or odd numbered select bit lines BL all become the write bit line BL. Thus, during the first stages of the write operation, the capacity of the adjacent bit lines BL is large, and boosting the pass voltage Vpass to apply to the nonselect bit line BL becomes difficult. Also, although there is a way to take the time and to charge the voltage of the nonselect bit line to the pass voltage Vpass, there is the possibility that the voltage of the nonselect bit line BL will not rise due to a leak.

Figure 10:
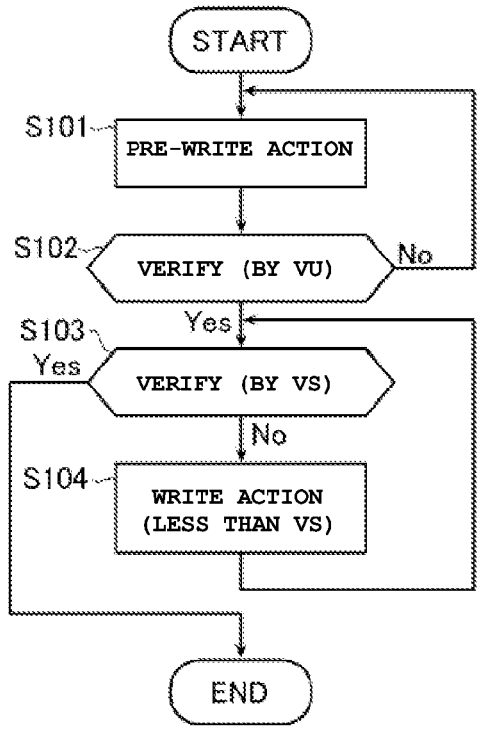
FIG. 10 is a flowchart that shows a write operation on a drain-side select transistor according to a third embodiment.
Figure 11:
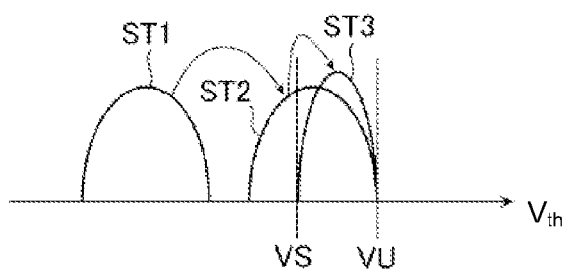
FIG. 11 is a diagram that shows changes in a threshold voltage of the drain-side select transistor of the third embodiment.

In response to the above problem, in Embodiment 3, a write operation is executed on the drain-side select transistor SDTr by a control that is different from that of Embodiment 1. Below, the write operation on the drain-side select transistor SDTr according to Embodiment 3 is described with reference to FIG. 10 and FIG. 11. FIG. 10 is a flowchart that shows the write operation on the drain-side select transistor SDTr according to Embodiment 3. FIG. 11 is a diagram that shows the changes in the threshold voltage distribution of the drain-side select transistor SDTr between ST1 and ST2, and between ST2 and ST3, according to Embodiment 3.

First, in Embodiment 3, before the write operation, a pre-write operation is executed (FIG. 10, S101). A pre-write operation is an action that moves the threshold voltages of all the drain-side select transistors SDTr that are connected to the even and odd numbered bit lines BL in the select block in the positive direction. Thus, the pass voltage Vpass will not be applied to the even numbered bit lines BL or the odd numbered bit lines BL. In the pre-write operation of Embodiment 3, all the bit lines BL are applied with the ground voltage Vss, and the program voltage Vpgm is applied to the drain-side select gate line SGD.

After the pre-write operation, the verify action is executed (FIG. 10, S102). The verify action in the step S102, as shown in FIG. 11, determines whether or not one of the drain-side select transistors SDTr has reached a verify level VU. That is, whether the upper end of a threshold voltage distribution ST2 of the drain-side select transistor SDTr has reached the verify level VU (pass) or not (fail). In the case that it is determined to have failed by this verify action (FIG. 10, No in S102), the action of step S101 is executed again.

On the other hand, in the case that it is determined to have passed by this verify action (FIG. 10, Yes in S102), the verify action is executed (FIG. 10, S103). In the verify action of this step S103, as shown in FIG. 11, the drain-side select transistors SDTr that have a threshold voltage that is less than a verify level VS (however, VS<VU) are identified. Furthermore, in this step S103, it is determined whether the threshold of the entire drain-side select transistor SDTr has reached a verify level VS that is smaller than the verify level VU (pass) or not (fail).

In the case that it is determined to have failed by the verify action (S103) (FIG. 10, No in S103), the write operation is executed (FIG. 10, S104). The write operation of this step S104, like the previous embodiment, is done according to a method that separates the even numbered bit line BL and the odd numbered bit line BL. As shown in FIG. 11, it is executed only on the drain-side select transistor SDTr that possesses a threshold voltage that is less than the verify level VS (however, VS<VU), and other drain-side select transistors SDTr are made write inhibited. After this, step S103 is executed again.

In the case that it is determined to have passed by the verify action of step S103 (FIG. 10, Yes in S103) the write operation on the drain-side select transistor SDTr will be deemed to have completed and the action will terminate.

As stated above, by executing the pre-write operation that does not use the pass voltage Vpass before the write operation, the threshold voltage of most of the drain-side select transistor SDTr within the memory array 11 will reach the verify level VS. Also, in the following verify write operation, which is the same as the previous embodiment, the number of the drain-side select transistor SDTr that is the target of write is limited. Therefore, the virtual capacity of the bit line BL that looks like the load of the pass voltage Vpass will be kept small, and the generation of the pass voltage Vpass to apply to the nonselect bit line becomes easy.

Figure 12:
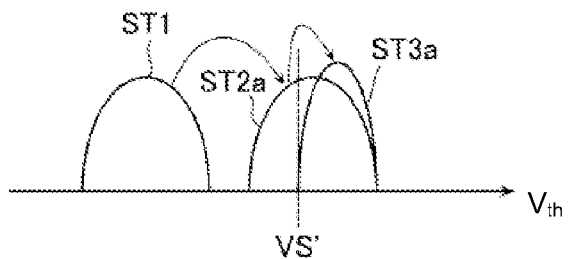
FIG. 12 is a diagram that shows the changes in the threshold voltage of the drain-side select transistor SDTr of the third embodiment.

Meanwhile, in Embodiment 3, regarding the verify action (S102) on the pre-write operation, in place of the method to terminate when one of the drain-side select transistors SDTr reaches the upper limit of the verify level VU, as shown in the threshold voltage distribution ST2a in FIG. 12, the pass/fail can be determined by whether the number of drain-side select transistors SDTr that go above the lower limit of the verify level VS' is determined to be over a set number or not. In that the following verify write operation is executed only on the drain-side select transistor SDTr that is equal to or less than the verify level VS', it is the same as the previous embodiment and the threshold distribution changes from ST2a to ST3a. In this case, there is the advantage that the capacity of the bit line BL that applies the pass voltage Vpass during the verify write operation of the latter half can be calculated in advance.

Embodiment 4

Figure 13:
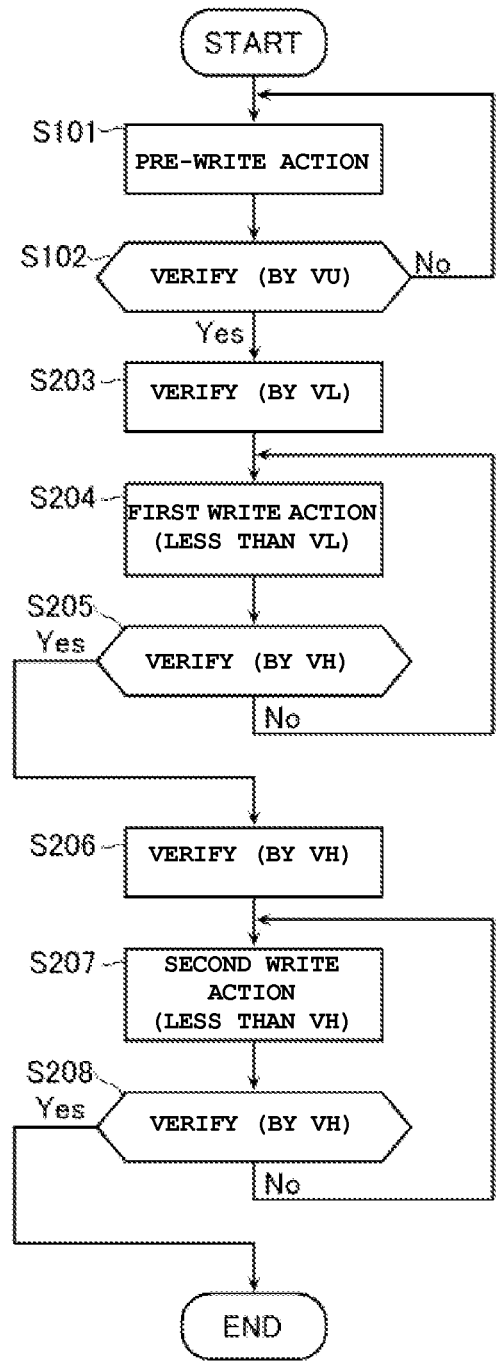
FIG. 13 is a flowchart that shows a write operation on a drain-side select transistor according to a fourth embodiment.
Figure 14:
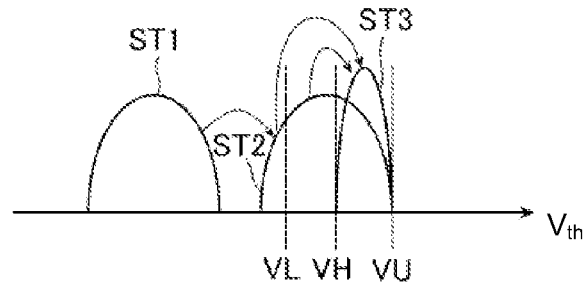
FIG. 14 is a diagram that shows changes in a threshold voltage of the drain-side select transistor SDTr of the fourth embodiment.

Next, the nonvolatile semiconductor storage device according to Embodiment 4 will be described, with reference to FIG. 13 and FIG. 14. FIG. 13 is a flowchart that shows the write operation on the drain-side select transistor SDTr according to Embodiment 4. FIG. 14 is a diagram that shows the changes in the threshold voltage distribution of the drain-side select transistor SDTr between ST1 and ST2, and between ST2 and ST3, according to Embodiment 4. Embodiment 4 serves to solve the same problem as Embodiment 3.

In Embodiment 4, first, like Embodiment 3, the pre-write operation (FIG. 13, S101) and the verify action (FIG. 13, S102) that do not use the pass voltage Vpass are executed. On the other hand, in Embodiment 4, the following verify write operation is separated into a first write operation on the drain-side select transistor SDTr with less than the verify level VL and a second write operation on the drain-side select transistor SDTr with a verify level VL to VH (however, VL<VH<VU).

That is, after the step S102, the next verify action and the first write operation are executed (FIG. 13, S203, S204). In the verify action in step S203, the drain-side select transistor SDTr with a threshold voltage that is less than the verify level VL is identified. The first write operation of step S204 is executed only on the drain-side select transistor SDTr that has a threshold voltage that is less than the identified verify level VL, and the other drain-side select transistors SDTr will be made write inhibited.

When the first write operation (step S204) is executed, the verify action of the next step S205 is executed. This verify action, as shown in FIG. 14, determines whether the threshold value of all the drain-side select transistors SDTr that are the target of the first write operation have reached the verify level VH (pass) or not (fail).

In the case that it is determined to have failed by step S205 (FIG. 13, No in S205), the first write operation (FIG. 13, S204) is executed again.

In the case that it is determined to have passed by step S205 (FIG. 13, Yes in S205), the next verify action and the second write operation is executed (FIG. 13, S206, S207). The verify action in step S206 identifies the drain-side select transistor SDTr whose threshold voltage is less than the verify level VH. The second write operation of step S207 is executed only on the identified drain-side select transistor SDTr that has a threshold voltage that is less than the verify level VH. The other drain-side select transistors SDTr are made write inhibited.

When the second write operation (step 207) is executed, the next step S208 of the verify action is executed. This verify action, as shown in FIG. 14, determines whether the threshold value of all the drain-side select transistors SDTr that are the targets of the second write operation have reached the verify level VH (pass) or not (fail).

In the case that it is determined to have failed by step S208 (FIG. 13, No in S208), the second write operation (FIG. 13, S207) is executed again.

In the case that it is determined to have passed by step S208 (FIG. 13, Yes in S208), the write operation on the drain-side select transistor SDTr will be deemed to have completed and the action will terminate.

With the above controls, Embodiment 4 will yield the same effects as Embodiment 3. Furthermore, Embodiment 4, due to the write operation of step S204 and S207, limits the number of drain-side select transistors SDTr that become the target of the write operation at one time. Therefore, in Embodiment 4, the capacity of the virtual adjacent bit line BL that becomes the load of the pass voltage Vpass can be kept even smaller, and the generation of the pass voltage Vpass to apply to the nonselect bit line BL will become even easier than Embodiment 3.

Figure 15:
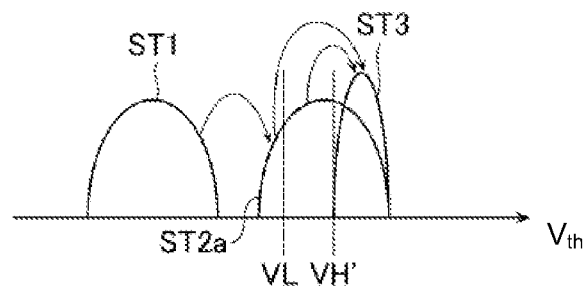
FIG. 15 is a diagram that shows the changes in the threshold voltage of the drain-side select transistor SDTr of the fourth embodiment.

Also in Embodiment 4, regarding the verify action (S102) on the pre-write operation, in place of the method to terminate when one of the drain-side select transistors SDTr reaches the upper limit of the verify level VU, as shown in the threshold voltage distribution ST2a in FIG. 15, the pass/fail can be determined by whether the number of drain-side select transistors SDTr that go above the lower limit of the verify level VH' is to be over a set number or not. The write operation of the following two steps is the same as the previous embodiment.

Embodiment 5

Figure 16:
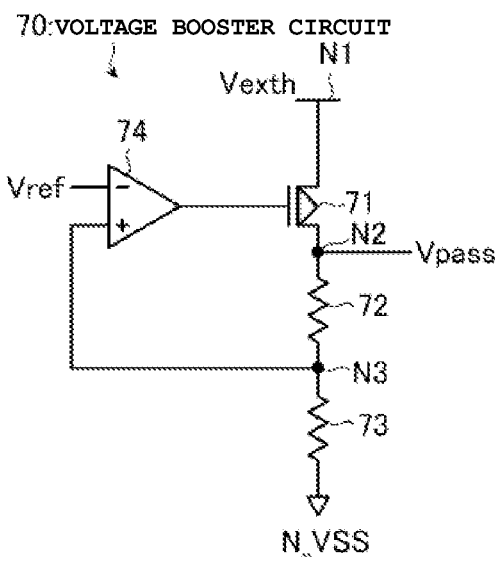
FIG. 16 is a circuit diagram that shows a voltage down converter of a fifth embodiment.

Next, the nonvolatile semiconductor storage device according to Embodiment 5 will be described with reference to FIG. 16. Embodiment 5, as shown in FIG. 16, has a voltage down converter 70 that generates the pass voltage Vpass by lowering an external voltage Vexth that is provided from an external power source. The voltage down converter 70 includes a pMOS transistor 71, resistors 72, 73, and a comparator 74.

The pMOS transistor 71 is formed in between a node N1, which is applied with the external voltage Vexth, and a node N2 which outputs the pass voltage Vpass. The resistors 72 and 73 are serially connected and are formed in between the node N2 and a ground terminal N_VSS. The comparator 74 has its non-inverting input terminals connected to a node N3 that is between the resistor 72 and resistor 73, and a reference voltage Vref is applied to that inverting input terminal. Furthermore, an output terminal of the comparator 74 is connected to the gate of the pMOS transistor 71.

This embodiment generates the pass voltage Vpass with the voltage down converter 70. Therefore, as described in the Embodiments 3 and 4, the pass voltage Vpass can be generated without considering the boosting performance.

Embodiment 6

Next, the nonvolatile semiconductor storage device according to Embodiment 6 will be described.

In the example shown in FIG. 12 of Embodiment 3, until the number of drain-side select transistors SDTr that exceed the verify level VS' is determined to be over a set number, the pre-write operation is executed on all the drain-side select transistors SDTr at the same time. In contrast, in Embodiment 6, the pre-write operation is executed only on the drain-side select transistor SDTr that has a threshold voltage that is less than the verify level VS' in FIG. 12. Regarding the drain-side select transistor SDTr that has a threshold voltage exceeding the verify level VS' in FIG. 12, the pre-write operation is suppressed.

Figure 17:
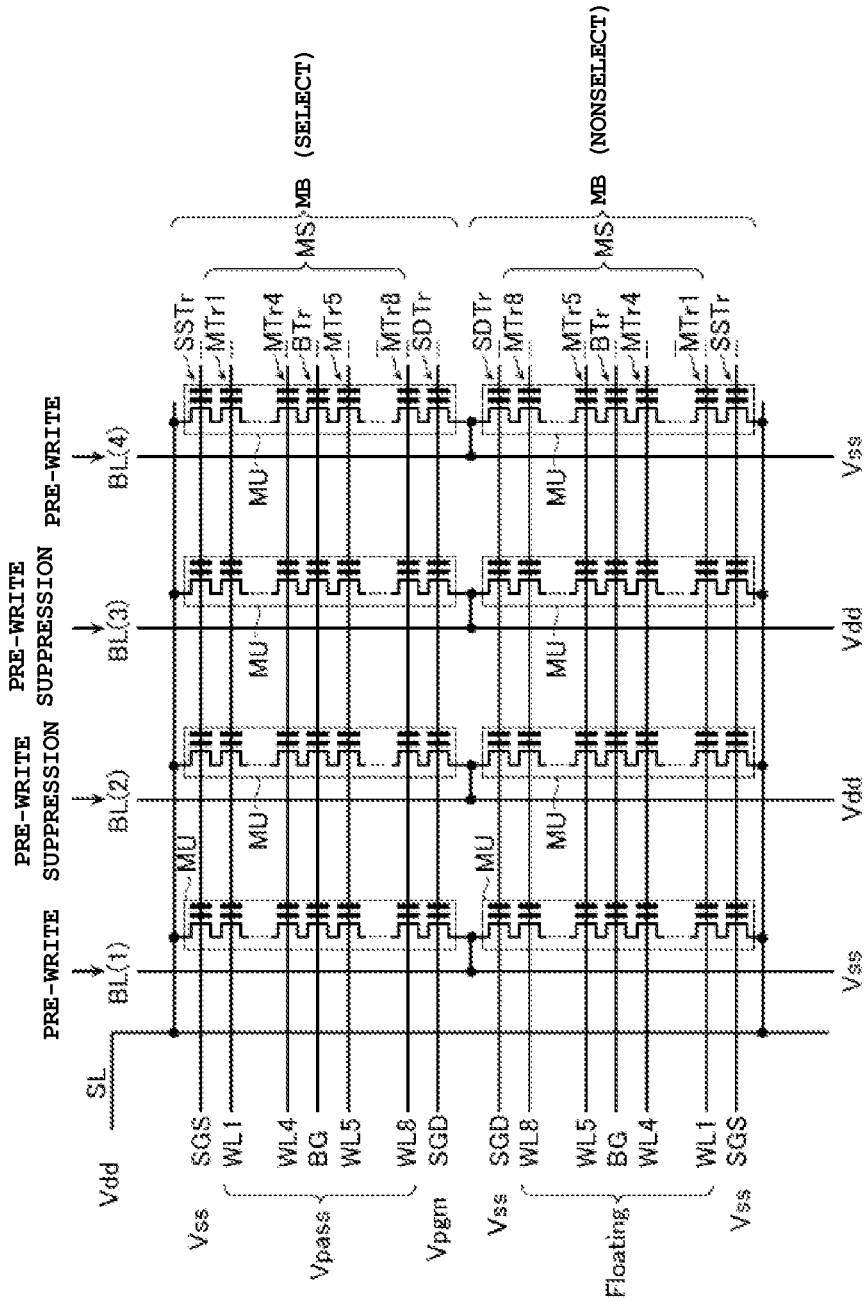
FIG. 17 is a schematic diagram that shows a pre-write operation of a sixth embodiment.

Below, the pre-write operation of Embodiment 6 will be described with reference to FIG. 17. FIG. 17 is a schematic diagram that shows the pre-write operation pertaining to Embodiment 6. In FIG. 17, the drain-side select transistor SDTr that is connected to the bit lines BL (1) and BL (4) has a threshold voltage that is less than the verify level VS', and the drain-side select transistor SDTr that is connected to the bit lines BL (2) and BL (3) has a threshold voltage that exceeds the verify level VS'. Thus, the bit lines BL (1) and BL (4) are made the pre-write bit line BL (1) and BL (4), and the pre-write operation is executed on the drain-side select transistor SDTr that is connected to them. The bit lines BL (2) and BL (3) are made the pre-write suppression bit lines BL (2) and BL (3), and the pre-write operation is will be suppressed on the drain-side select transistor SDTr that is connected to them.

The pre-write operation in the example shown in FIG. 12 of Embodiment 3 applies the ground voltage Vss to all the bit lines BL. In contrast, the pre-write operation in Embodiment 6, as shown in FIG. 17, applies the ground voltage Vss to the pre-write bit lines BL (1) and BL (4), and the power source voltage Vdd is applied to the pre-write suppression bit lines BL (2) and BL (3). Meanwhile, the source line SL is applied with the power source voltage Vdd, and the other wirings are applied the same voltage as the write operations of Embodiment 1.

As stated above, in the controls shown in FIG. 17, the voltage of the pre-write suppression bit lines BL (2) and BL (3) can only be raised to the power source voltage Vdd, the write operation cannot be sufficiently inhibited on the drain-side select transistor SDTr that is connected to them, and the threshold voltage of that drain-side select transistor SDTr will be moved in the positive direction. However, the movement of the threshold voltage of the drain-side select transistor SDTr that is connected to the pre-write suppression bit lines BL (2) and BL (3) will be suppressed more than that of the drain-side select transistor SDTr that is connected to the pre-write bit lines BL (1) and BL (4). Therefore, in Embodiment 6, the width of the threshold distribution of the drain-side select transistor SDTr due to the pre-write operation can be made narrower than Embodiment 3. Furthermore, because the number of the drain-side select transistors SDTr that will be its target during the write operation after the pre-write operation can be reduced, the problem pertaining to the pass voltage Vpass described in Embodiment 3 can be ameliorated. The pre-write operation of Embodiment 6 can also be applied to Embodiment 4.

Embodiment 7

Figure 18:
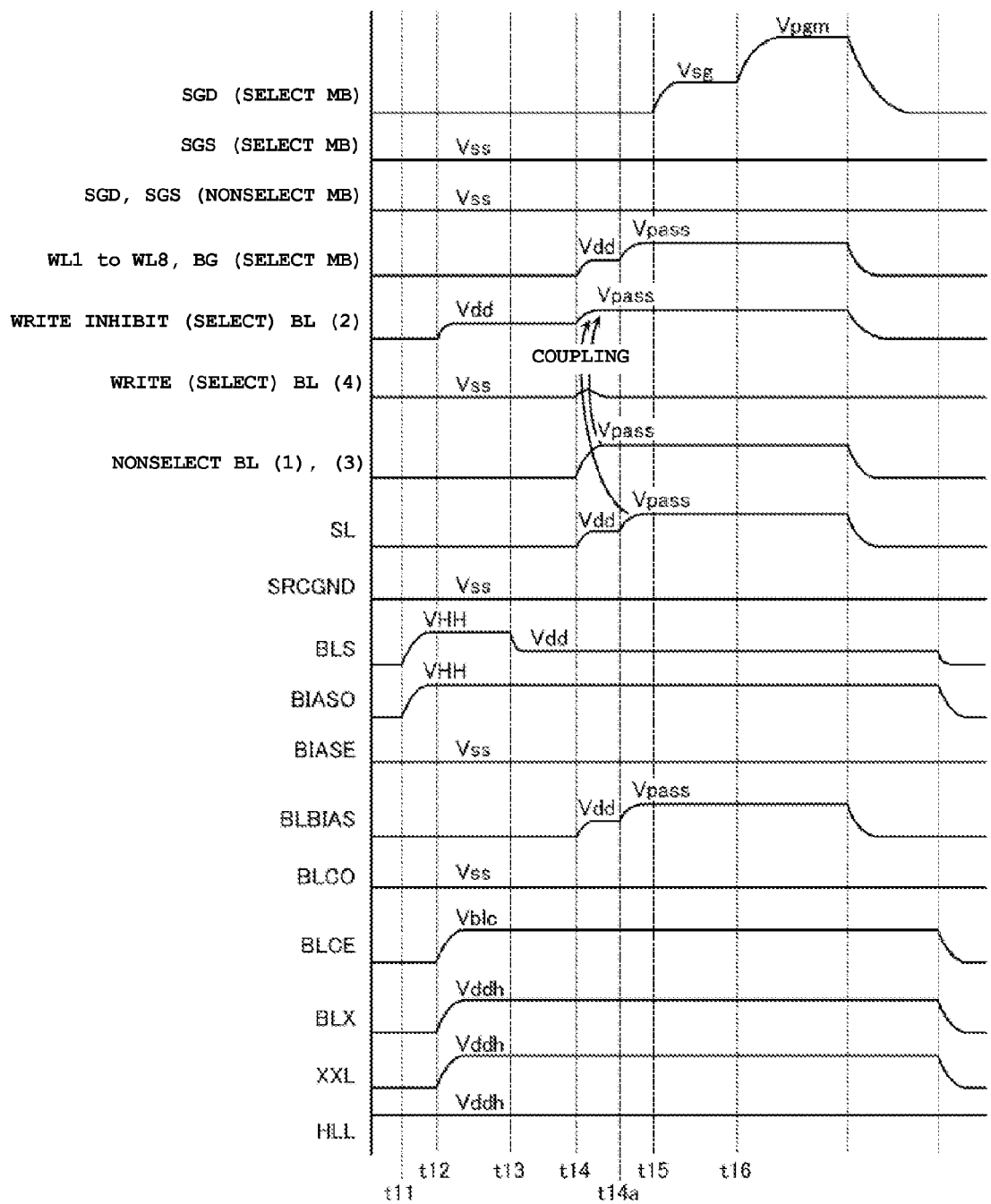
FIG. 18 is a timing chart for the various signals during a write operation of a drain-side select transistor SDTr of a seventh embodiment.

Next, the nonvolatile semiconductor storage device according to Embodiment 7 is described with reference to FIG. 18. FIG. 18 is a timing chart for the various signals during the write operation of the drain-side select transistor SDTr according to Embodiment 7.

In Embodiment 1, the signal BLBIAS, the voltage of the source line SL, the voltages of the word lines WL1 to WL8, and the voltage of the back gate line BG, at time t14, is raised to the pass voltage Vpass all at once (see FIG. 7). In contrast, in Embodiment 7, as shown in FIG. 18, the signal BLBIAS, the voltage of the source line SL, the voltages of the word lines WL1 to WL8 and the voltage of the back gate line BG, at time t14, are raised to the power source voltage Vdd by the power source terminal. Then, at time t14a, they are raised to the pass voltage Vpass by the voltage booster circuit.

As stated above, due to the control shown in FIG. 18, in Embodiment 7, the charge amount that needs to be provided by the voltage booster circuit in order to raise it to the pass voltage Vpass is reduced (V becomes smaller in Q=CV), and so the load on the voltage booster circuit can be reduced.

Other Embodiments

While certain embodiments have been described, these embodiments have been presented by way of example only, and are not intended to limit the scope of the invention. Indeed, the novel embodiment described herein may be embodied in a variety of other forms. Furthermore, various omissions, substitutions and changes in the form of the embodiment described herein may be made without departing from the spirit of the invention. The accompanying claims and their equivalents are intended to cover such forms or modifications as would fall within the scope and spirit of the invention.

For example, in the embodiment, the select bit line BL and the nonselect bit line BL are configured to be alternately controlled, but as long as the two that adjoin a select bit line BL are always nonselect bit lines BL, the select bit lines BL can be placed every nth place (n is an integer larger than 2). The point is, if the select bit line and the nonselect bit line are regularly placed in space, the circuit that applies the pass voltage Vpass to the nonselect bit line can be composed with a small area.

Furthermore, in order to accurately execute the write operation on the drain-side select transistor SDTr, the threshold voltage of the source-side select transistor SSTr becomes a problem. Thus, in Embodiment 1, in the case that the source-side select transistor SSTr has a negative threshold voltage, a write operation is executed on all the source-side select transistors SSTr in the memory array 11, and their threshold voltages are adjusted to a positive threshold voltage. With this, in the write operation on the drain-side select transistor SDTr, the source-side select transistor SSTr is maintained in a nonconductive state.

Moreover, in Embodiment 1, in the case that the source-side select transistor SSTr has a negative threshold voltage, the voltage of the write bit line BL is configured, not to the ground voltage Vss, but to a positive voltage Vbll. With this, the voltage of the source of the source-side select transistor SSTr becomes the voltage Vbll, and the voltage between the gate/source can be made negative. Thus, in the write operation on the drain-side select transistor SDTr, the source-side select transistor SSTr is maintained in a nonconductive state.

In Embodiment 2, in order to accurately execute a write operation on the drain-side select transistor SDTr, the threshold voltage of the source-side dummy transistor SDMTr and the drain-side dummy transistor DDMTr becomes a problem, just as is the case with the source-side select transistor SSTr. Thus, in Embodiment 2, in the case that the source-side dummy transistor SDMTr and the drain-side dummy transistor DDMTr have a negative threshold voltage, write operation is executed on all the source-side dummy transistors SDMTr and drain-side dummy transistors DDMTr in the memory array 11, and their threshold voltages are adjusted to a positive threshold voltage.

In each of the explained embodiments, a stacked NAND flash memory is illustrated as an example, but it goes without saying that this invention can also be applied to a normal NAND flash memory that does not have a three-dimensional structure.

Also, in the above embodiments, the memory string MS which includes a channel formed in a U-shape when seen from the row direction is described as one example, but this embodiment can also be applied to a memory string MS that includes a channel formed in an I-shape when seen from the row and column direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Structure of the memory cell array 10 is not limited as described above. A memory cell array may have the structure disclosed in U.S. patent application Ser. No. 12/532,030, the entire contents of which are incorporated by reference herein.

What is claimed is:

1. A nonvolatile semiconductor storage device comprising:
   multiple memory strings including multiple memory transistors connected in series;
   multiple first transistors that have first ends that are respectively connected to first ends of the multiple memory strings and are configured to be capable of having an adjustable threshold voltage;
   multiple bit lines each corresponding to one of the multiple memory strings, that are each connected to second ends of the multiple first transistors;
   a first line that connects gates of the multiple first transistors; and
   a control circuit configured to execute the write operation on the first transistors by applying a set voltage to the multiple bit lines and the first line,
   wherein the control circuit, during the write operation, configures the multiple bit lines so that the two bit lines that are adjacent to select bit lines are nonselect bit lines, applies a first voltage to a write bit line that is included in the select bit lines, then, after applying a second voltage that is higher than the first voltage to a write inhibit bit line that is included in the select bit lines, applies a third voltage that is higher than the second voltage to the nonselect bit lines, and while raising the voltage on the write inhibit bit line, maintains the write bit line at the first voltage, and then applies a fourth voltage for the write operation to the first line.

2. The nonvolatile semiconductor storage device according to claim 1, further comprising:
   multiple second transistors that have first ends that are respectively connected to second ends of the multiple memory strings; and
   a source line that connects second ends of the multiple second transistors,
   wherein the control circuit, during the write operation, raises the voltage of the source line to the third voltage.

3. The nonvolatile semiconductor storage device according to claim 2, further comprising:
   multiple first dummy transistors that are respectively arranged between the first ends of the multiple first transistors and the first ends of the multiple memory strings; and
   a first dummy word line that connects gates of the multiple first dummy transistors,
   wherein the control circuit, during the write operation, applies a fifth voltage that is larger than the first voltage and smaller than the third voltage to the first dummy word line.

4. The nonvolatile semiconductor storage device according to claim 2, further comprising:
   multiple second dummy transistors that are respectively arranged between the first ends of the multiple second transistors and the second ends of the multiple memory strings; and
   a second dummy word line that connects gates of the multiple second dummy transistors,
   wherein the control circuit, during the write operation, applies a fifth voltage that is larger than the first voltage and smaller than the third voltage to the source-side select gate line.

5. The nonvolatile semiconductor storage device according to claim 1, wherein the control circuit, before the write operation, applies the first voltage to the write bit line, and executes a pre-write operation by applying the fourth voltage to the first line to move the threshold voltage of the first transistors in the positive direction, until the threshold voltage of one of the multiple first transistors reaches the upper limit level.

6. The nonvolatile semiconductor storage device according to claim 1, wherein the control circuit, before the write operation, applies the first voltage to the write bit line, and executes a pre-write operation by applying the fourth voltage to the first line to move the threshold voltage of the first transistors in the positive direction, until the threshold voltage of a predetermined number of the first transistors exceeds the lower limit level.

7. The nonvolatile semiconductor storage device according to claim 1, wherein the control circuit,
   before the write operation, executes a pre-write operation to move the threshold voltage of the first transistors in the positive direction until the threshold voltage of a predetermined number of the first transistors reaches a set level, and
   in the pre-write operation, selects as a pre-write bit line the bit line that is connected to the first transistor that possesses a threshold voltage less than the set level, and selects as a pre-write suppression bit line the bit line that is connected to the first transistor possessing a threshold voltage that exceeds the set level, applies the first voltage to the pre-write bit line, applies the second voltage to the pre-write suppression bit line, and applies the fourth voltage to the first line.

8. The nonvolatile semiconductor storage device according to claim 7, wherein the control circuit, after the pre-write operation, groups the first transistors for which the threshold voltages have not reached the lower limit level according to the threshold voltage, and executes the write operation on the first transistor for each of the groups.

9. The nonvolatile semiconductor storage device according to claim 6, wherein the control circuit, after the pre-write operation, groups the first transistors for which the threshold voltages have not reached the lower limit level according to the size of the threshold voltage, and executes the write operation on the first transistor for each of the groups.

10. The nonvolatile semiconductor storage device according to claim 1, further comprising:
    a voltage booster circuit configured to generate the third voltage.

11. The nonvolatile semiconductor storage device according to claim 1, wherein the memory string comprises:
    a substrate;
    a first semiconductor layer that includes a columnar part extending in a direction that is perpendicular to the substrate and functions as the body of the memory transistor;

a first charge accumulation layer that is composed so that it can accumulate charge on the side surface of the columnar part; and a first conductive layer that functions as the gate of the memory transistor on the side surface of the columnar part via the first charge accumulation layer.

12. The nonvolatile semiconductor storage device according to claim 11, wherein the first transistor comprises:

a second semiconductor layer that extends in a direction perpendicular to the substrate and functions as the body of the first transistor;

a second charge accumulation layer that is composed so that it can accumulate charge on the side surface of the second semiconductor layer; and a second conductive layer that functions as the gate of the first transistor on the side surface of the second semiconductor layer via the second charge accumulation layer.

13. A method of controlling a write operation in a nonvolatile semiconductor storage device that includes:

multiple memory strings including multiple memory transistors connected in series;

multiple first transistors that have first ends that are respectively connected to first ends of the multiple memory strings and are configured to be capable of having an adjustable threshold voltage;

multiple bit lines each corresponding to one of the multiple memory strings that are each connected to second ends of the multiple first transistors;

a first line that connects gates of the multiple first transistors; and a control circuit configured to execute the write operation on the first transistors by applying a set voltage to the multiple bit lines and the first line, wherein the method includes the steps of:

applying a first voltage to a write bit line that is included in select bit lines;

applying a second voltage that is higher than the first voltage to a write inhibit bit line that is included in the select bit lines;

applying a third voltage that is higher than the second voltage to nonselect bit lines;

while raising the voltage on the write inhibit bit line, maintaining the write bit line at the first voltage; and applying a fourth voltage for the write operation to the first line.

14. The method according to claim 13, wherein the nonvolatile semiconductor storage device further comprises multiple second transistors that have first ends that are respectively connected to second ends of the multiple memory strings, and a source line that connects second ends of the multiple second transistors, and the method further comprises:

during the write operation, raising the voltage of the source line to the third voltage.

15. The method according to claim 14, wherein the nonvolatile semiconductor storage device further comprises multiple first dummy transistors that are respectively arranged between the first ends of the multiple first transistors and the first ends of the multiple memory strings, and a first dummy word line that connects gates of the multiple first dummy transistors, and the method further comprises:

during the write operation, applying a fifth voltage that is larger than the first voltage and smaller than the third voltage to the first dummy word line.

16. The method according to claim 14, wherein the nonvolatile semiconductor storage device further comprises multiple second dummy transistors that are respectively arranged between the first ends of the multiple second transistors and the second ends of the multiple memory strings, and a second dummy word line that connects gates of the multiple second dummy transistors, and the method further comprises:

during the write operation, applying a fifth voltage that is larger than the first voltage and smaller than the third voltage to the second line.

17. The method according to claim 13, further comprising:

before the write operation, applying the first voltage to the write bit line, and executing a pre-write operation by applying the fourth voltage to the first line to move the threshold voltage of the first transistors in the positive direction, until the threshold voltage of one of the multiple first transistors reaches the upper limit level.

18. The method according to claim 13, further comprising:

before the write operation, applying the first voltage to the write bit line, and executing a pre-write operation by applying the fourth voltage to the first line to move the threshold voltage of the first transistors in the positive direction, until the threshold voltage of a predetermined number of the first transistors exceeds the lower limit level.

19. The method according to claim 13, further comprising:

before the write operation, executing a pre-write operation to move the threshold voltage of the first transistors in the positive direction until the threshold voltage of a predetermined number of the first transistors reaches a set level, wherein the pre-write operation includes:

selecting as a pre-write bit line the bit line that is connected to the first transistor that possesses a threshold voltage less than the set level, selecting as a pre-write suppression bit line the bit line that is connected to the first transistor possessing a threshold voltage that exceeds the set level, applying the first voltage to the pre-write bit line, applying the second voltage to the pre-write suppression bit line, and applying the fourth voltage to the first line.

20. A nonvolatile semiconductor storage device comprising:

multiple memory strings that are made of serially connected multiple memory transistors that can be electrically overwritten;

multiple first transistors that have first ends that are respectively connected to first ends of the multiple memory strings and are configured to have an adjustable threshold voltage during a write operation;

multiple bit lines each corresponding to one of the multiple memory strings, that are arranged to be parallel to each other, and are each connected to second ends of the multiple first transistors;

a first line that connects gates of the multiple first transistors;

multiple second transistors that have first ends that are respectively connected to second ends of the multiple memory strings;

a source line that connects second ends of the multiple second transistors;

multiple first dummy transistors that are respectively arranged between the first ends of the multiple first transistors and the first ends of the multiple memory strings;

a first dummy word line that connects gates of the multiple first dummy transistors;

multiple second dummy transistors that are respectively arranged between the first ends of the multiple second transistors and the second ends of the multiple memory strings;
a second dummy word line that connects gates of the multiple second dummy transistors; and
a control circuit configured to apply, during the write operation, applies voltages of different levels to the bit lines and applies a voltage that is between highest of the different levels and lowest of the different levels to the first dummy word line and the second dummy word line.

\* \* \* \* \*